(12) United States Patent
Learn et al.

(10) Patent No.: US 7,838,423 B2
(45) Date of Patent: Nov. 23, 2010

(54) METHOD OF FORMING CAPPING STRUCTURES ON ONE OR MORE MATERIAL LAYER SURFACES

(75) Inventors: Arthur J. Learn, Cupertino, CA (US); Steven R. Sherman, Newton, MA (US); Robert Michael Geffken, Burlington, VT (US); John J. Hautala, Beverly, MA (US)

(73) Assignee: TEL Epion Inc., Billerica, MA (US)

( * ) Notice: Subject to any disclaimer, the term of this patent is extended or adjusted under 35 U.S.C. 154(b) by 29 days.

(21) Appl. No.: 12/412,749

(22) Filed: Mar. 27, 2009

(65) Prior Publication Data

US 2009/0186482 A1 Jul. 23, 2009

Related U.S. Application Data

(63) Continuation of application No. 11/671,813, filed on Feb. 6, 2007, which is a continuation-in-part of application No. 11/269,382, filed on Nov. 8, 2005, now Pat. No. 7,291,558.

(60) Provisional application No. 60/625,831, filed on Nov. 8, 2004, provisional application No. 60/765,664, filed on Feb. 6, 2006.

(51) Int. Cl.
  *H01L 21/44* (2006.01)
(52) U.S. Cl. ............... 438/687; 438/597; 438/658; 438/680; 438/686; 438/758; 257/E21.476; 257/E21.591
(58) Field of Classification Search ............... 438/687; 257/E21.476, E21.591
  See application file for complete search history.

(56) References Cited

U.S. PATENT DOCUMENTS

| | | | |
|---|---|---|---|
| 4,361,762 A | 11/1982 | Douglas | |
| 4,559,096 A | 12/1985 | Friedman et al. | |
| 4,886,971 A | 12/1989 | Matsumura et al. | |
| 4,916,311 A | 4/1990 | Fuzishita et al. | |
| 5,290,732 A | 3/1994 | Kumar et al. | |
| 5,561,326 A | 10/1996 | Ito et al. | |
| 5,814,194 A | 9/1998 | Deguchi et al. | |
| 6,008,078 A | 12/1999 | Zhang | |
| 6,110,828 A | 8/2000 | Guo et al. | |
| 6,124,620 A * | 9/2000 | Gardner et al. | 257/411 |

(Continued)

FOREIGN PATENT DOCUMENTS

| | | |
|---|---|---|
| JP | 62296357 A | 12/1987 |
| WO | 2007092856 A2 | 8/2007 |

OTHER PUBLICATIONS

Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

(Continued)

*Primary Examiner*—Charles D Garber
*Assistant Examiner*—Angel Roman
(74) *Attorney, Agent, or Firm*—Wood, Herron & Evans, LLP

(57) ABSTRACT

Methods of forming capping structures on one or more different material surfaces are provided. One embodiment includes disposing a semiconductor structure in a reduced pressure chamber, forming a capping GCIB within the reduced pressure chamber, and directing the capping GCIB onto at least one of the one or more different material surfaces, so as to form at least one capping structure on the one or more surfaces onto which the capping GCIB is directed.

32 Claims, 15 Drawing Sheets

U.S. PATENT DOCUMENTS

| | | |
|---|---|---|
| 6,800,565 B2 | 10/2004 | Hu et al. |
| 6,812,147 B2 | 11/2004 | Skinner |
| 7,008,871 B2 | 3/2006 | Andricacos et al. |
| 7,022,598 B2 | 4/2006 | Shingubara et al. |
| 7,291,558 B2 | 11/2007 | Geffken et al. |
| 2002/0130275 A1 | 9/2002 | Mack et al. |
| 2002/0139772 A1* | 10/2002 | Fenner ............ 216/60 |
| 2003/0073314 A1 | 4/2003 | Skinner et al. |
| 2003/0143340 A1* | 7/2003 | Akizuki et al. ............ 427/596 |
| 2003/0201491 A1* | 10/2003 | Chung ............ 257/324 |
| 2004/0060900 A1 | 4/2004 | Waldhauer et al. |
| 2004/0137158 A1* | 7/2004 | Kools et al. ............ 427/404 |
| 2004/0137645 A1* | 7/2004 | Hu et al. ............ 438/3 |
| 2004/0229452 A1 | 11/2004 | Johnston et al. |
| 2005/0014360 A1 | 1/2005 | Yu et al. |
| 2005/0247926 A1* | 11/2005 | Sun et al. ............ 257/19 |
| 2006/0043590 A1 | 3/2006 | Chen et al. |
| 2006/0264051 A1 | 11/2006 | Thibaut |
| 2007/0184655 A1 | 8/2007 | Learn et al. |
| 2007/0184656 A1 | 8/2007 | Sherman et al. |

OTHER PUBLICATIONS

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).

U.S. Patent and Trademark Office; Office Action issued in U.S. Appl. No. 11/671,813 mailed Nov. 17, 2009, 30 pp.

U.S. Patent and Trademark Office, Non-final Office Action issued in related U.S. Appl. No. 11/671,860 dated Dec. 1, 2009, 21 pp.

* cited by examiner

METHOD OF FORMING CAPPING STRUCTURES ON ONE OR MORE MATERIAL LAYER SURFACES

CROSS REFERENCE TO RELATED PATENT APPLICATIONS

The present application is a continuation of U.S. patent application Ser. No. 11/671,813, titled COPPER INTERCONNECT WIRING AND METHOD AND APPARATUS OF FORMING THEREOF, filed 6 Feb. 2007, which is a continuation-in-part of U.S. patent application Ser. No. 11/269,382, filed 8 Nov. 2005, now U.S. Pat. No. 7,291,558, issued Nov. 6, 2007, titled COPPER INTERCONNECT WIRING AND METHOD OF FORMING THEREOF, which claims the benefit of priority to U.S. Provisional Application Ser. No. 60/625,831, filed 8 Nov. 2004. The contents of all the aforementioned applications are hereby incorporated herein by reference as if laid out in their entirety.

FIELD OF THE INVENTION

This invention relates generally to capping layers on one or more material layers surfaces of a semiconductor structure and to improved methods for forming capping layers by the application of gas-cluster ion-beam (GCIB) processing.

BACKGROUND OF THE INVENTION

The continuous "Moore's Law" scaling of semiconductors to higher densities and greater performance has provided tremendous increases in productivity for the industry and our society. However, a problem resulting from this scaling is the requirement to carry ever-higher electrical currents in smaller and smaller interconnection wires. When the current densities and temperatures in such small wires get too high, the interconnect wires can fail by a phenomenon called electromigration. The effects of the so-called "electron wind" that occurs in high current-density interconnect wires causes metal atoms to be swept away from their original lattice positions, resulting in either an open circuit in the wire or an extrusion short in an area where these diffusing metal atoms collect. The introduction of copper as a wiring material to replace aluminum provided a tremendous improvement in electromigration lifetime, however the continued scaling of interconnect wiring suggests that additional improvements in copper electromigration lifetime will be needed in the future.

Unlike aluminum interconnects, which fail by diffusion of aluminum atoms along grain boundaries, the copper interconnect electromigration failure mode is controlled by diffusion along surfaces and interfaces. In particular, for conventional copper wiring interconnect schemes, the top surface of a copper wire typically has an overlying dielectric capping layer, which must have good diffusion barrier properties to prevent migration of copper into the surrounding dielectric. The two most commonly used dielectric capping materials are silicon nitride and silicon carbon nitride, which are conventionally deposited by a plasma-enhanced chemical vapor deposition (PECVD) technique. Unfortunately, these PECVD deposited capping materials form a defective interface with the copper that results in enhanced copper migration along the top surface of the copper wire and therefore higher electromigration failure rates. Other surfaces of a copper wire structure typically have interfaces with a barrier layer or bi-layer (typically metallic, as for example TaN/Ta, TaN/Ru, or Ru) that forms a strong interface with the copper to limit copper diffusion and therefore suppress electromigration effects. We refer to such a barrier layer or bi-layer as a "barrier layer".

There have been attempts to improve electromigration of copper wiring by capping the top surfaces of copper wires with selectively deposited metal caps. Indeed, when the top copper interface has been capped with either selective tungsten or a selective cobalt tungsten phosphide (CoWP) metallic layer, tremendous improvements in copper electromigration lifetimes have been reported. Unfortunately, all of the methods that use a selective metallic capping solution have some probability of also depositing some metal on the adjacent insulator surface and therefore causing unintended leakage or shorts between adjacent metal lines. The present invention uses gas-cluster ion-beam processing to solve many of these problems.

FIG. 1 shows a schematic illustrating the wiring scheme 300 of a prior art silicon nitride capped copper interconnect, as commonly used in the copper dual damascene integration process. It comprises a first copper wire layer 302, a second copper wire layer 304, and copper via structure 306 connecting the two copper layers. Sidewalls and bottoms of both wire layers 302 and 304 and the via structure 306 are all lined with a barrier layer 312. The barrier layer 312 provides excellent diffusion barrier properties, which prevent diffusion of the copper into the adjacent insulator structure and also provides an excellent low diffusion interface with the copper that suppresses electromigration along these interfaces. First inter-level dielectric layer 308 and second inter-level dielectric layer 310 provide insulation between the copper wires. The top surface of first copper wire layer 302 and the top surface of the second copper wire layer 304 are each covered with insulating barrier films 314 and 316, respectively, which are typically composed of silicon nitride or silicon carbon nitride. These insulating barrier films 314 and 316 are conventionally deposited by PECVD and the interfaces that they form with the exposed copper surfaces are rather defective and offer fast diffusion paths for migrating copper atoms. In this prior art wiring scheme, it is along these interfaces that almost all of the undesirable material movement occurs during copper electromigration. In conventional dual damascene copper interconnects like this, at each interconnect level, after formation of trenches and vias in the inter-level dielectric layer and subsequent deposition of copper to form interconnect wires and vias, there follows a planarization step typically performed using chemical mechanical polishing (CMP) techniques. Corrosion inhibitors are used in both CMP and post-CMP brush cleaning processes and these corrosion inhibitors and other contaminants must be removed from the copper surface with an in-situ cleaning prior to the deposition of a capping layer. Use of an ex-situ cleaning process would leave the copper surface vulnerable to corrosion and oxidation. PECVD reactors are typically not configured to perform an effective in-situ cleaning of the copper surface prior to the insulator capping layer deposition. Although not shown in FIG. 1, the wiring scheme 300 is typically formed on a semiconductor substrate containing active and/or passive elements requiring electrical interconnection to complete an integrated circuit.

FIG. 2 shows a wiring scheme 400 of a prior art selective metal-capped copper interconnect. It comprises a first copper wire layer 402, a second copper wire layer 404, and copper via structure 406 connecting the two copper layers. The sidewalls and bottoms of both wire layers 402 and 404 and the via structure 406 are all lined with a barrier layer 412. The barrier layer 412 provides excellent diffusion barrier properties, which prevent diffusion of the copper into the adjacent insulator structure and also provides an excellent low diffusion interface with the copper that suppresses electromigration along these interfaces. First inter-level dielectric layer 408 and second inter-level dielectric layer 410 provide insulation between copper wires. The top surface of first copper wire layer 402 and the top surface of the second copper wire layer 404 are each capped with selectively deposited metallic layers 414 and 416, respectively, which are typically composed of either selective tungsten or selective CoWP deposited by chemical vapor deposition (CVD) or an electroless technique, respectively. In this conventional dual damascene copper interconnect, at each interconnect level, after formation of trenches and vias in the inter-level dielectric layer and subsequent deposition of copper to form interconnect wires and vias, there follows a planarization step typically performed using chemical mechanical polishing (CMP) techniques. Corrosion inhibitors are used in both CMP and post-CMP brush cleaning processes and these and other contaminants must be removed from the copper surface prior to the capping layer deposition. When the top copper interface of a copper layer has been capped with either a tungsten or a CoWP metallic layer, large improvements in copper electromigration lifetimes have been reported. Unfortunately, all of the methods that use a selective metallic capping solution have some probability of also depositing unwanted metal 418, shown for example, on adjacent insulator surfaces, and therefore can result in electrical leakage or shorts between adjacent metal lines. Although selective metal deposition techniques offer the promise of very large electromigration improvements, they have not been widely implemented in manufacturing because of the high potential for loss of yield on semiconductor die due to the deposition of unwanted metal. Although not shown in FIG. 2, the wiring scheme 400 is typically formed on a semiconductor substrate containing active and/or passive elements requiring electrical interconnection to complete an integrated circuit.

The use of a gas-cluster ion beam for processing surfaces is known (see for example, U.S. Pat. No. 5,814,194, Deguchi et al.) in the art. As the term is used herein, gas-clusters are nano-sized aggregates of materials that are gaseous under conditions of standard temperature and pressure. Such gas-clusters typically consist of aggregates of from a few to several thousand molecules loosely bound to form the gas-cluster. The gas-clusters can be ionized by electron bombardment or other means, permitting them to be formed into directed beams of controllable energy. Such ions each typically carry positive charges of q·e (where e is the electronic charge and q is an integer of from one to several representing the charge state of the gas-cluster ion). Non-ionized gas-clusters may also exist within a gas-cluster ion beam. The larger sized gas-cluster ions are often the most useful because of their ability to carry substantial energy per gas-cluster ion, while yet having only modest energy per molecule. The gas-clusters disintegrate on impact, with each individual molecule carrying only a small fraction of the total gas-cluster ion energy. Consequently, the impact effects of large gas-cluster ions are substantial, but are limited to a very shallow surface region. This makes gas-cluster ions effective for a variety of surface modification processes, without the tendency to produce deeper subsurface damage characteristic of conventional monomer ion beam processing. Means for creation of and acceleration of such GCIBs are described in the reference (U.S. Pat. No. 5,814,194) previously cited. Presently available gas-cluster ion sources produce gas-cluster ions having a wide distribution of sizes, N (where N=the number of molecules in each gas-cluster ion—in the case of monatomic gases like argon, an atom of the monatomic gas will be referred to as a molecule and an ionized atom of such a monatomic gas will be referred to as a molecular ion—or simply a monomer ion—throughout this discussion). Many useful surface-processing effects can be achieved by bombarding surfaces with GCIBs. These processing effects include, but are not necessarily limited to, cleaning, smoothing, etching, doping, and film formation or growth. U.S. Pat. No. 6,537,606, Allen et al., teaches the use of GCIBs for corrective etching of an initially non-uniform thin film to improve its spatial uniformity. The entire content of U.S. Pat. No. 6,537,606 is incorporated herein by reference.

Upon impact of an energetic gas-cluster on the surface of a solid target, penetration of the atoms of the cluster into the target surface is typically very shallow because the penetration depth is limited by the low energy of each individual constituent atom and depends principally on a transient thermal effect that occurs during the gas-cluster ion impact. Gas-clusters dissociate upon impact and the individual gas atoms then become free to recoil and possibly escape from the surface of the target. Other than energy carried away by the escaping individual gas atoms, the total energy of the energetic cluster prior to impact becomes deposited into the impact zone on the target surface. The dimensions of a target impact zone are dependent on the energy of the cluster but are on the order of the cross-sectional dimensions of the impacting cluster and are small, for example, roughly 30 Angstroms in diameter for a cluster comprised of 1000 atoms. Because of the deposition of most of the total energy carried by the cluster into the small impact zone on the target, an intense thermal transient occurs within the target material at the impact site. The thermal transient dissipates quickly as energy is lost from the impact zone by conduction deeper into the target. Duration of the thermal transient is determined by the conductivity of the target material but will typically be less than $10^{-6}$ second.

Near a gas-cluster impact site, a volume of the target surface can momentarily reach temperatures of many hundreds to several thousands of degrees Kelvin. As an example, impact of a gas-cluster carrying 10 keV total energy has been estimated to be capable of producing a momentary temperature increase of about 2000 degrees Kelvin throughout a highly agitated, approximately hemispherical zone extending to about 100 Angstroms below the surface. This high thermal transient promotes intermixing and reaction of the workpiece and gas-cluster ion beam constituents and thus results in improved electromigration lifetime.

Following initiation of an elevated temperature transient within the target volume below an energetic gas-cluster impact site, the affected zone cools rapidly. Some of the gas-cluster constituents escape during this process, while others remain behind and become incorporated in the surface. A portion of the original surface material may also be removed by sputtering or like effects. In general, the more volatile and inert constituents of the gas-cluster are more likely to escape, while the less volatile and more chemically reactive constituents are more likely to become incorporated into the surface. Although the actual process is likely much more complex, it is convenient to think of the gas-cluster impact site and the surrounded affected zone as a "melt zone" wherein the gas-cluster atoms may briefly interact and mix with the substrate surface and wherein the gas-cluster materials either escape the surface or become infused into the surface to the depth of the affected zone. The term "infusion" or "infusing" is used by the inventors to refer to this process to distinguish it from ion "implantation" or "implanting", a very different process that produces very different results. Noble gases in the energetic gas-cluster ion, such as argon and xenon, for example, being volatile and non-reactive have a high probability of escape from the affected zone, while materials such as carbon, boron, fluorine, sulfur, nitrogen, oxygen, germanium, and silicon, for example, being less volatile and/or more likely to form chemical bonds, are more likely to remain in the affected zone, becoming incorporated in the surface of the substrate.

Noble inert gases such as argon and xenon, for example, not for limitation, can be mixed with gases containing elements that are less volatile and more reactive to form mixed clusters. Such gas-clusters can be formed with existing gas-cluster ion beam processing equipment as will be described hereinafter, by using suitable source gas mixtures as the source gas for gas-cluster ion beam generation, or by feeding two or more gases (or gas mixtures) into the gas-cluster ion generating source and allowing them to mix in the source. In a recent publication, Borland et al. ("USJ and strained-Si formation using infusion doping and deposition", Solid State Technology, May 2004, p 53) have shown that GCIB infusion can produce graded surface layers transitioning smoothly from the substrate material to the deposited layer on the surface.

BRIEF DESCRIPTION OF THE FIGURES

For a better understanding of the present invention, together with other and further objects thereof, reference is made to the accompanying drawings and detailed description, wherein.

DETAILED DESCRIPTION OF CERTAIN EMBODIMENTS OF THE INVENTION

Figure 1:
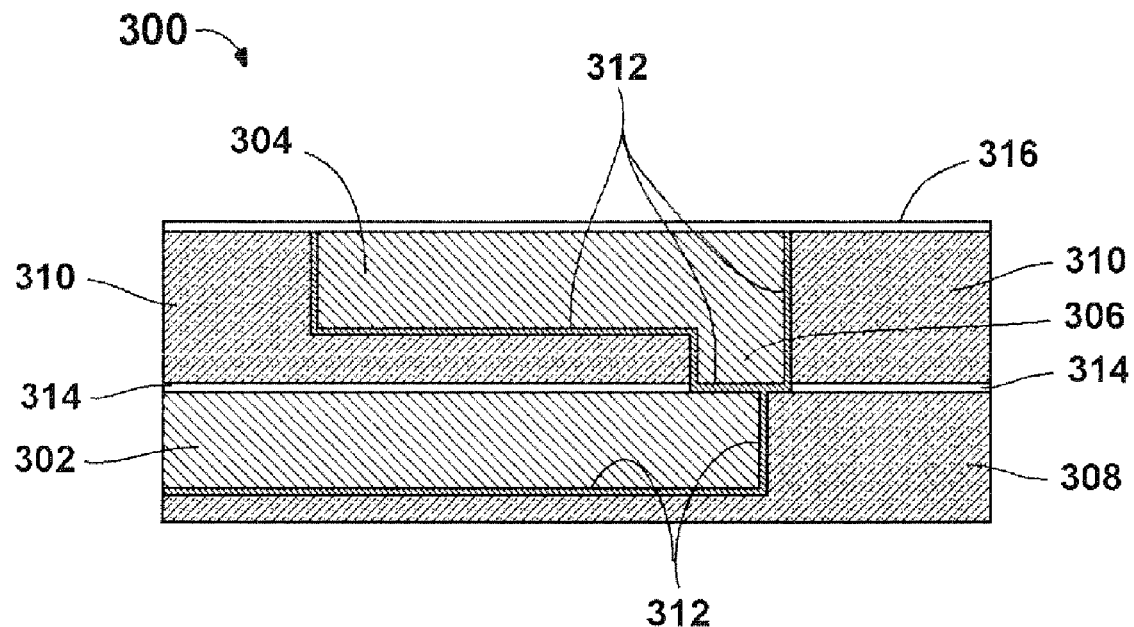
FIG. 1 is a schematic showing a prior art silicon nitride capped copper interconnect wiring scheme.
Figure 2:
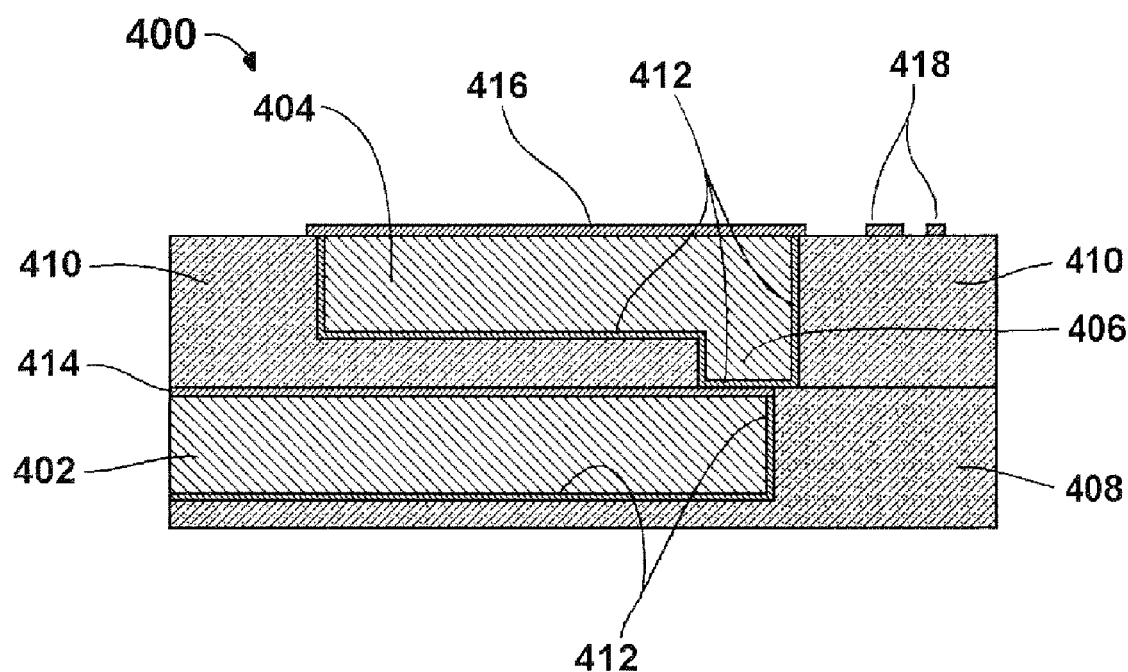
FIG. 2 is a schematic showing a prior art selective-metal capped copper interconnect wiring scheme.
Figure 3:
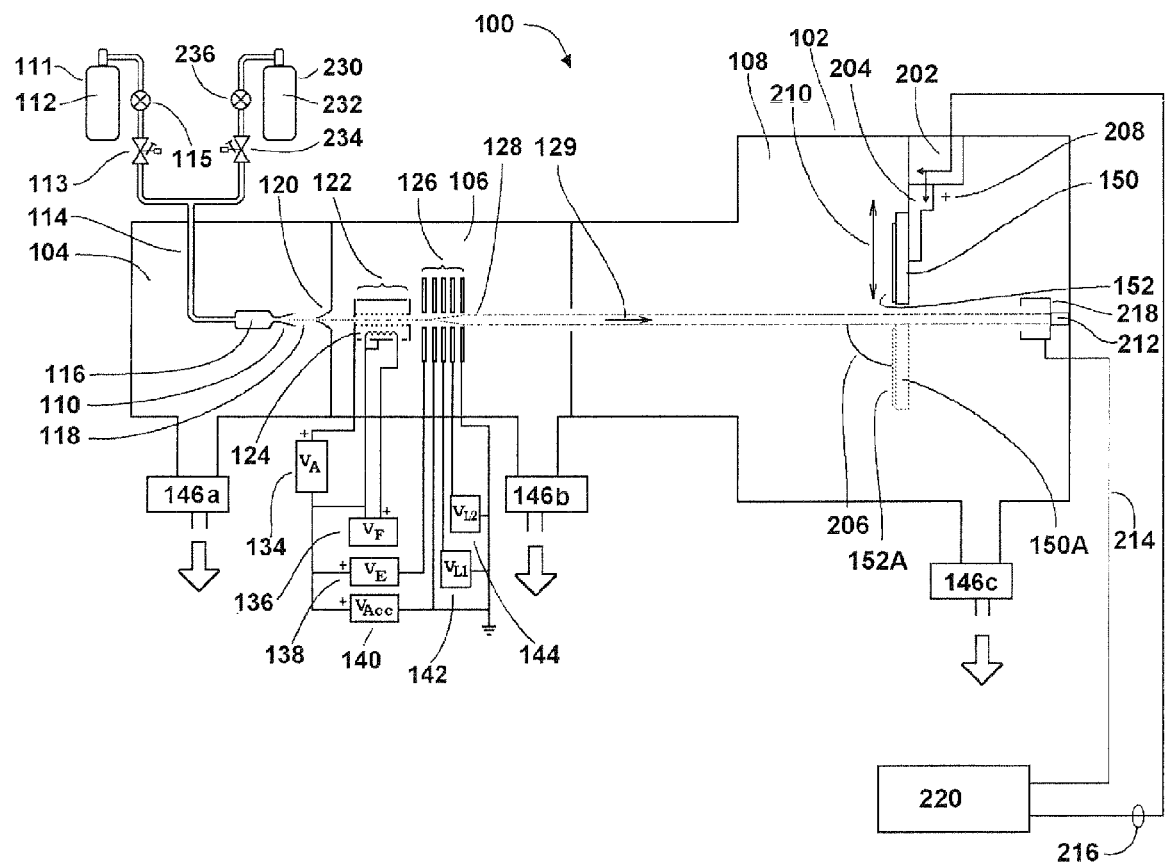
FIG. 3 is a schematic showing the basic elements of a prior art GCIB processing apparatus.

FIG. 3 shows a schematic of the basic elements of a typical configuration for a GCIB processing apparatus 100 of a form known in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A first condensable source gas 112 (for example argon or nitrogen or a premixed gas mixture) stored in a first gas storage cylinder 111 is admitted under pressure through a first gas shut-off valve 115 and through a first gas metering valve 113 and gas feed tube 114 into stagnation chamber 116. An optional second condensable source gas 232 (for example carbon dioxide, oxygen, or a premixed gas mixture) stored in an optional second gas storage cylinder 230 is optionally admitted under pressure through a second gas shut-off valve 236 and through a second gas metering valve 234. When both source gases are used, they mix in gas feed tube 114 and stagnation chamber 116. Gas or gas mixtures in the stagnation chamber 116 is ejected into the substantially lower pressure vacuum through a properly shaped nozzle 110. A supersonic gas jet 118 results. Cooling, which results from the expansion in the jet, causes a portion of the gas jet 118 to condense into gas-clusters, each consisting of from several to several thousand weakly bound atoms or molecules. A gas skimmer aperture 120 partially separates the gas molecules that have not condensed into a gas-cluster jet from the gas-cluster jet so as to minimize pressure in the downstream regions where such higher pressures would be detrimental (e.g., ionizer 122, high voltage electrodes 126, and processing chamber 108). Suitable condensable source gases 112 include, but are not necessarily limited to argon, nitrogen, carbon dioxide, oxygen, and other gases and/or gas mixtures.

After the supersonic gas jet 118 containing gas-clusters has been formed, the gas-clusters are ionized in an ionizer 122. The ionizer 122 is typically an electron impact ionizer that produces thermoelectrons from one or more incandescent filaments 124 and accelerates and directs the electrons causing them to collide with the gas-clusters in the gas jet 118, where the jet passes through the ionizer 122. The electron impact ejects electrons from the gas-clusters, causing a portion the gas-clusters to become positively ionized. Some gas-clusters may have more than one electron ejected and may become multiply ionized. A set of suitably biased high voltage electrodes 126 extracts the gas-cluster ions from the ionizer, forming a beam, and then accelerates them to a desired energy (typically with acceleration potentials of from several hundred V to several tens of kV) and focuses them to form a GCIB 128. Filament power supply 136 provides filament voltage $V_f$ to heat the ionizer filament 124. Anode power supply 134 provides anode voltage $V_A$ to accelerate thermoelectrons emitted from filament 124 to cause them to irradiate the gas-cluster containing gas jet 118 to produce ions. Extraction power supply 138 provides extraction voltage $V_E$ to bias a high voltage electrode to extract ions from the ionizing region of ionizer 122 and to form a GCIB 128. Accelerator power supply 140 provides acceleration voltage $V_{Acc}$ to bias a high voltage electrode with respect to the ionizer 122 so as to result in a total GCIB acceleration potential equal to $V_{Acc}$. One or more lens power supplies (142 and 144 shown for example) may be provided to bias high voltage electrodes with focusing voltages ($V_{L1}$ and $V_{L2}$ for example) to focus the GCIB 128.

A workpiece 152, which may be a semiconductor wafer or other workpiece to be processed by GCIB processing, is held on a workpiece holder 150, which can be disposed in the path of the GCIB 128. Since most applications contemplate the processing of large workpieces with spatially uniform results, a scanning system is desirable to uniformly scan the GCIB 128 across large areas to produce spatially homogeneous results.

The GCIB 128 is stationary, has a GCIB axis 129, and the workpiece 152 is mechanically scanned through the GCIB 128 to distribute the effects of the GCIB 128 over a surface of the workpiece 152.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform (or otherwise programmed) irradiation of a surface of the workpiece 152 by the GCIB 128 for processing of the workpiece 152. The workpiece holder 150 disposes the workpiece 152 at an angle with respect to the axis of the GCIB 128 so that the GCIB 128 has an angle of beam incidence 206 with respect to the workpiece 152 surface. The angle of beam incidence 206 may be 90 degrees or some other angle, but is typically 90 degrees or near 90 degrees. During Y-scanning, the workpiece 152 and the workpiece holder 150 move from the position shown to the alternate position "A" indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 3, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is typically affixed to the wall of the vacuum vessel 102 with an electrically insulating mount 212.

A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve desired processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

Figure 4A:
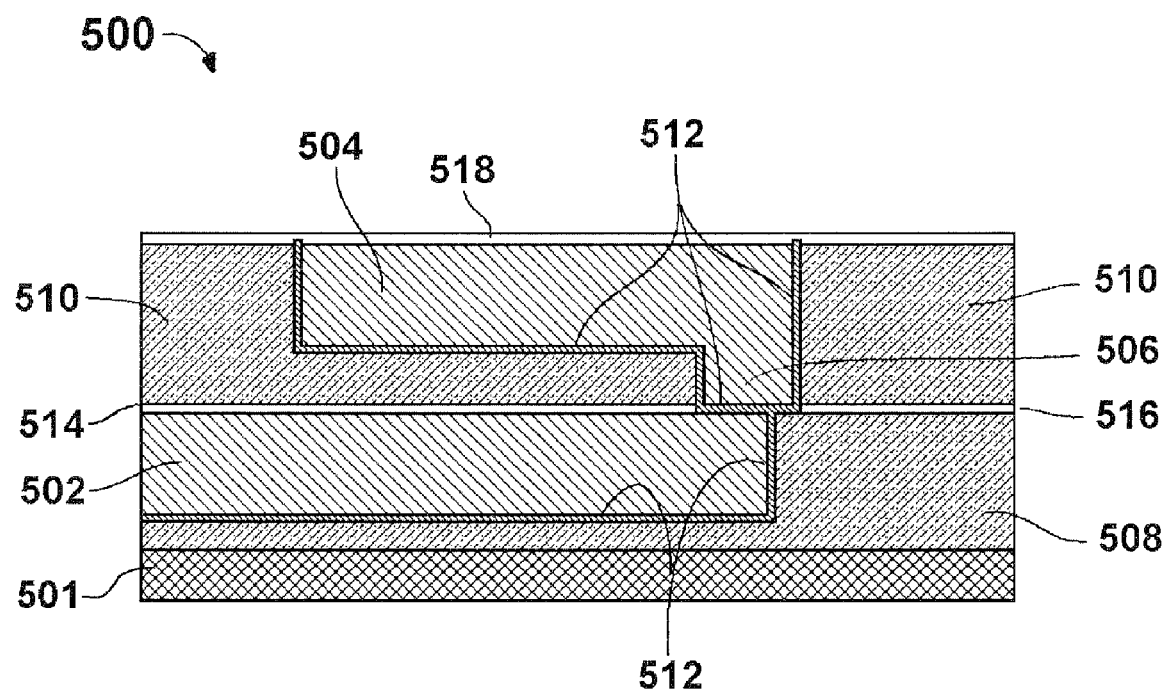
FIGS. 4A, 4B, 4C, 4D, and 4E are schematics showing a process of copper interconnect capping by GCIB infusion according to a first embodiment of the invention.

FIG. 4A is a schematic showing a wiring scheme 500 of a copper interconnect capped using GCIB infusion according to a first embodiment of the invention (showing for example, not for limitation, two copper wire layer interconnect levels). The schematic shows a substrate 501 supporting a first copper wire layer 502, a second copper wire layer 504, and copper via structure 506 connecting the two copper layers, each of which may be formed using conventional techniques. The substrate 501 is typically a semiconductor substrate containing active and/or passive elements (possibly including lower interconnect levels) requiring electrical interconnection. The sidewalls and bottoms of both copper wire layers 502 and 504 and the via structure 506 are lined with a TaN/Ta or other conventional barrier layer 512, which may be formed using conventional techniques. First inter-level dielectric layer 508 and second inter-level dielectric layer 510 provide electrical insulation between the copper wire layers and other components and may be formed using conventional techniques. The top surface of first copper wire layer 502 and the top surface of first inter-level dielectric layer 508 and the top surface of the second copper wire layer 504 and the top surface of second inter-level dielectric layer 510 are all capped by GCIB processing to form capping films 514, 516, and 518. A separate GCIB capping process is preferably performed at the top surface of each interconnection level. In a conventional dual damascene copper interconnect, after formation of trenches and vias in the inter-level dielectric layer and subsequent deposition of copper to form interconnect wires and vias, a planarization step is typically performed upon the exposed copper and inter-level dielectric layer material surfaces using chemical mechanical polishing (CMP) techniques. Corrosion inhibitors are used on the surfaces to be polished in both the CMP technique and post-CMP brush cleaning process, are preferably removed (with other contaminants) from the copper and dielectric surfaces with an in-situ cleaning just prior to the capping layer formation (as used herein, "in-situ" means that the cleaning occurs in the same reduced-pressure atmosphere in which the capping deposition is performed without returning to atmospheric pressure between cleaning and capping steps and with reduced opportunity for re-contamination of the cleaned surface between the cleaning step and the capping step). PECVD reactors are typically not configured to perform an effective in-situ cleaning of copper surfaces prior to insulator capping layer deposition. Unlike PECVD systems, GCIB processing systems such as, for example, processing apparatus 100, are readily and typically configured to accomplish a sequential cleaning and capping in-situ. Following cleaning of the exposed copper and inter-level dielectric surfaces, which may be performed by GCIB processing as described below, preferably in-situ, a GCIB infusion process is used to cap the planarized surface (copper and exposed inter-level dielectric simultaneously).

Figure 4B:
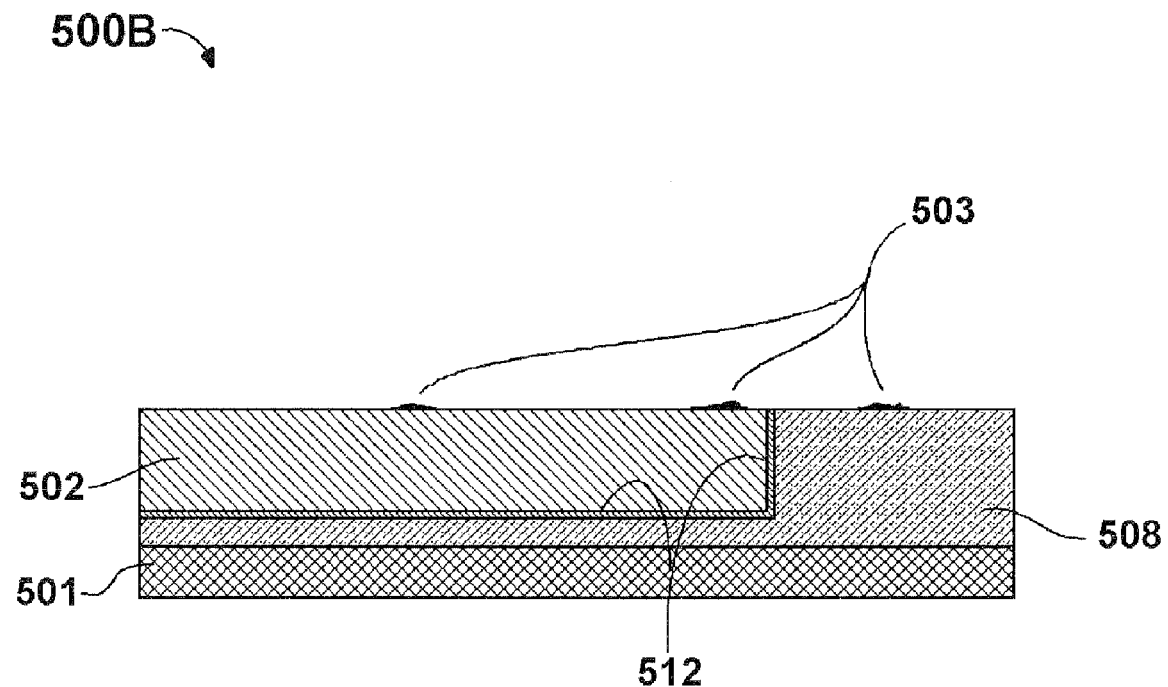

FIG. 4B shows a preliminary stage 500B of the wiring scheme 500. In the stage illustrated, an interconnect level is has been formed on a substrate 501. The interconnect level includes a first inter-level dielectric 508 that has been deposited on the substrate using conventional techniques. Conventional trenches and vias have been formed in the first inter-level dielectric 508 and have been lined with a conventional barrier layer 512. Copper has been deposited in the trenches and vias using conventional techniques. The upper surface of the structure has been planarized and cleaned utilizing conventional processes. The upper surfaces of first copper wire layer 502 and first inter-level dielectric layer 508 have residual contaminants 503. At this stage, and at a corresponding stages of each subsequent interconnect level (assuming more than one interconnect level), a GCIB cleaning process may be performed. GCIB cleaning involves irradiating the surface(s) to be cleaned with GCIB cluster ions composed of molecules of any of the gases Ar, $N_2$, $NH_3$, or $H_2$ or mixtures thereof, and using a beam acceleration potential, $V_{Acc}$, preferably in the range of from about 3 kV to about 50 kV, and with a total gas-cluster ion dose in the range of from about $5 \times 10^{13}$ to about $5 \times 10^{16}$ ions/cm$^2$. Those skilled in the art will realize that the invention is not limited to these example gases, but rather can be practiced with other gases or gas mixtures that remove post-CMP residues, copper oxide, and other contaminants from the copper surface. It is preferable, although not essential to the invention, that this GCIB cleaning process be an in-situ cleaning process.

Figure 4C:
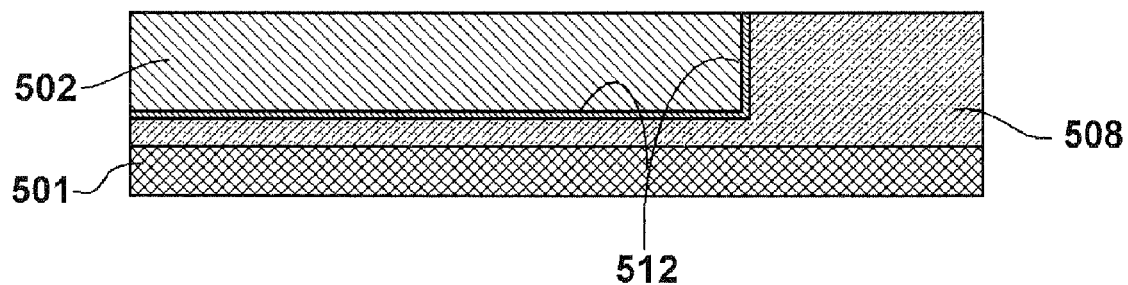

FIG. 4C shows a stage 500C of the wiring scheme 500, following the GCIB cleaning step. The upper surfaces of first copper wire layer 502 and first inter-level dielectric layer 508 have been cleaned of contaminants and are prepared for a capping step. At this stage and at a corresponding stage of each subsequent interconnect level (assuming more than one interconnect level), a GCIB capping process is performed. The GCIB capping process involves irradiating the upper surfaces of first copper wire layer 502 and/or first inter-level dielectric layer 508 with a GCIB comprised of reactive elements that form insulating materials upon their infusion into the original exposed dielectric and/or copper surfaces. GCIBs with gas-cluster ion elements comprised of, for example, C, N, O, Si, B, or Ge, or mixtures thereof are suitable and can form graded capping films such as, for example, $Si_3N_4$, SiCN, CuCO$_3$, and BN on copper. Other elements and combinations that form suitable dielectric materials when infused into copper and/or adjacent insulators may also be utilized. Source gases such as, for example, CH$_4$, SiH$_4$, NH$_3$, N$_2$, CO$_2$, B$_2$H$_6$, GeH$_4$ and mixtures thereof my be employed. Such gases can be used to form cluster ions in their pure form or by mixing them with inert gases such as, for example, Ar or Xe. With reference to the GCIB processing apparatus 100 of FIG. 3, a beam acceleration potential, V$_{Acc}$, in the range of from about 3 kV to about 50 kV may be used, and with a total gas-cluster ion dose in the range of from about $1\times10^{14}$ to about $1\times10^{17}$ ions/cm$^2$ to achieve infusion.

Figure 4D:
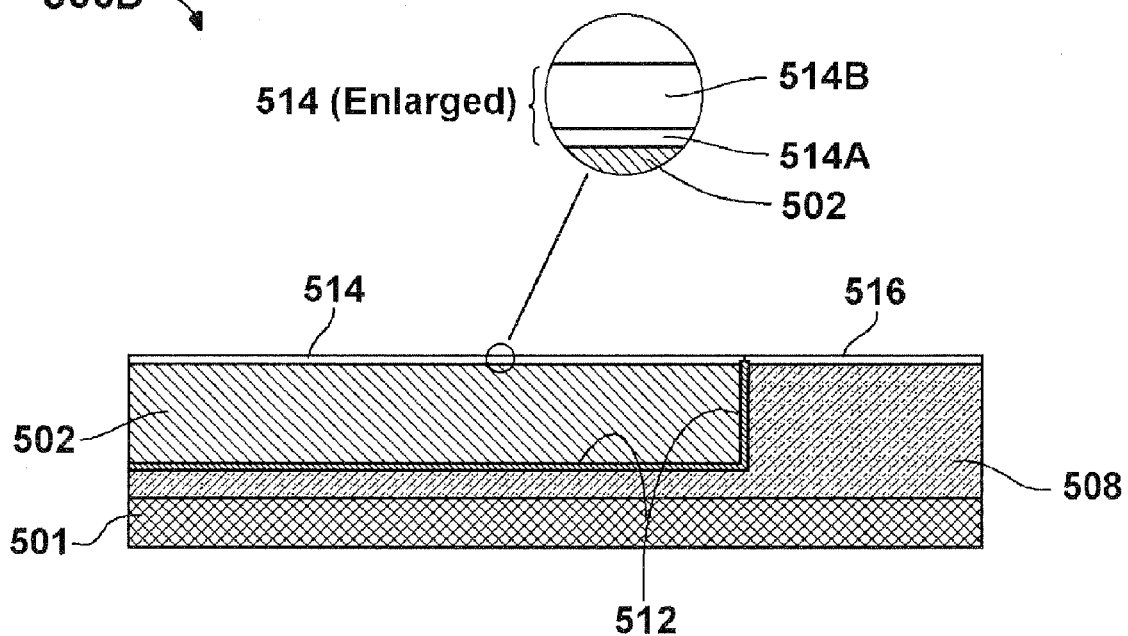

FIG. 4D shows a stage 500D of the wiring scheme 500, following a GCIB capping step. On copper surfaces and/or adjacent inter-level dielectric surfaces, the impact energy and thermal transients characteristic of the GCIB process infuse the top surface of the copper wire and/or of adjacent inter-level dielectric structures exposed to the GCIB, forming capping layers 514 and 516 respectively. Capping layers 514 and 516 may each optionally additionally comprise an upper layer portion that acts as a dielectric barrier film. During the initial part of the formation process, a graded layer 514A of mixed copper/GCIB species composition is infused into the copper surface. This mixed layer provides a graded interface between any subsequently deposited dielectric barrier film 514B and the underlying copper, thereby limiting copper diffusion at the interface and improving electromigration lifetime. Although a subsequently deposited dielectric barrier 514B layer can be a separate, additional, film deposited by conventional PECVD, it is preferable that it be deposited by GCIB as a continuation of the GCIB capping infusion step, simply continuing the capping GCIB irradiation process that initially creates the mixed graded layer until the process progresses (with increased dose) from an infusion process to a pure deposition process, depositing dielectric material above the mixed layer at the infused surface of the copper. The initial infused mixed graded layer 514A performs as a capping layer and, with continued GCIB irradiation, subsequent additional deposition of dielectric material forms the deposited dielectric barrier film 514B. This forms a dielectric film that is integral to the copper interconnect due to the mixed graded layer, thus resulting in improved interface properties including superior electromigration lifetime The same (or another) capping GCIB that forms the capping layer 514 preferably forms capping layer 516 on the inter-level dielectric 508. Like capping layer 514, the capping layer 516 may be a bi-layer. Capping layer 516 initially forms a mixed graded layer of mixed dielectric/GCIB species composition at the surface and with continued GCIB processing or with additional separate (for example PECVD) deposition may also comprise a deposited dielectric barrier film. If for example the dielectric barrier film 514B is not formed by using an extended GCIB process, or if an especially thick dielectric barrier film 514B is required, the infused capping layer 514A or capping layer 516 may optionally be over-capped with a conventional insulating layer, such as PECVD Si$_3$N$_4$, SiCN or SiC, to provide a dielectric barrier film for additional copper diffusion barrier or via etch-stop properties. Following the capping step and the formation of any dielectric barrier film, additional levels of interconnect can be added, if required, using conventional technology.

Figure 4E:
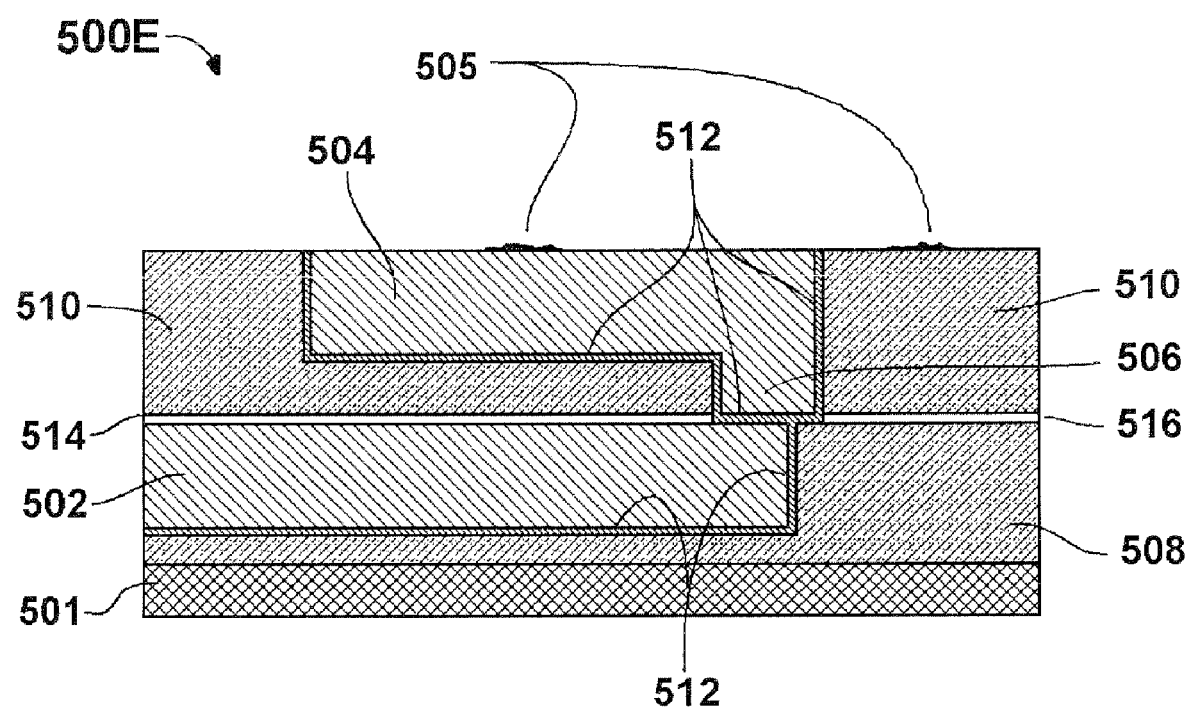

FIG. 4E shows a stage 500E of the wiring scheme 500, following the addition of a second interconnect level upon the GCIB capped (including dielectric barrier) first interconnect level. At this stage, a second interconnect level has been formed on the capped layers 514 and 516. The second interconnect level is comprised of a second inter-level dielectric 510 that has been deposited on the capped layer 514 and 516 using conventional techniques. Trenches and vias have been formed in the second inter-level dielectric 510, the trenches and vias have been lined with a barrier layer 512, and copper has been deposited in the trenches and vias using conventional techniques. The upper surface of the structure has been planarized and cleaned utilizing conventional processes such as, for example, CMP. The upper surfaces of second copper wire layer 504 and second inter-level dielectric layer 510 are shown to have residual contaminants 505. At the second interconnect level (if any) and at subsequent higher interconnect levels (if any) GCIB cleaning and GCIB infusing steps are applied as described above for wiring scheme 500, forming (for example) capping film 518 such as shown in FIG. 4A. Accordingly, two or multi-level interconnect structures may be formed as desired.

Accordingly, the techniques described provide for reduced electromigration, yet avoid the undesirable side effects associated with selective metal capping processes. On the dielectric surfaces, the infused layer and dielectric remains insulating and the extremely thin infusion layer has negligible effect on the overall dielectric constant of the layer and on the inter-layer capacitance.

Figure 5A:
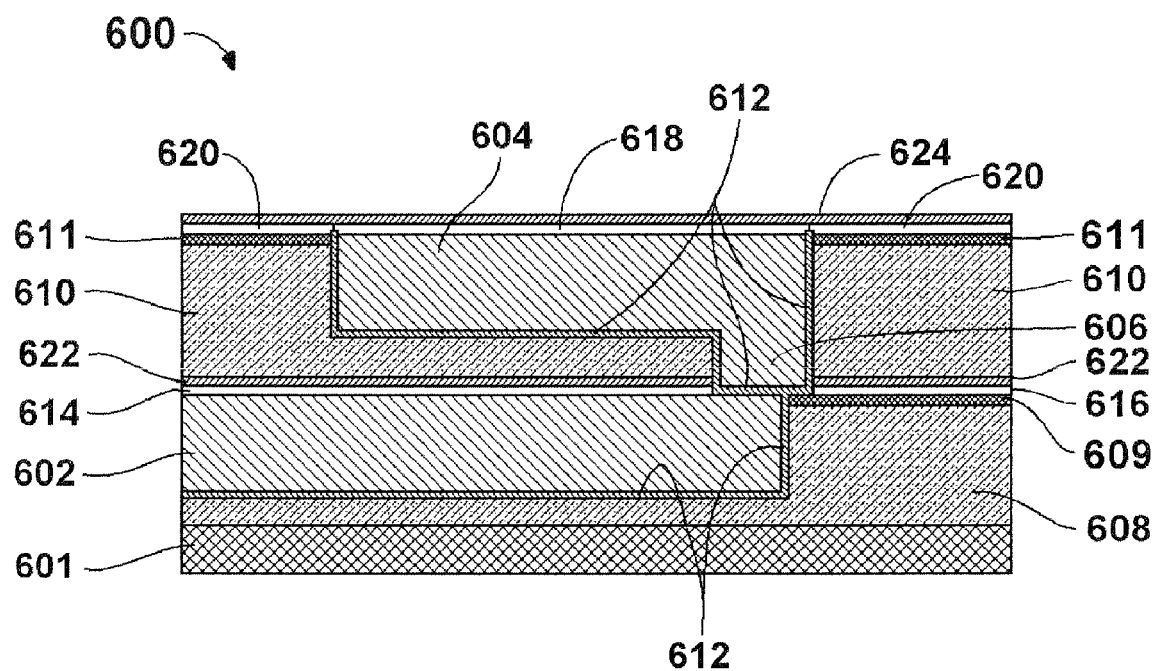
FIGS. 5A, 5B, 5C, 5D, 5E, 5F, 5G, 5H, 5I, 5J, 5K, and 5L are schematics showing a process of copper interconnect capping by using GCIB infusion and deposition according to a second embodiment of the invention.

FIG. 5A is a schematic showing a wiring scheme 600 of a copper interconnect capped using GCIB infusion and deposition according to a second embodiment of the invention (showing for example, not for limitation, two copper wire layer interconnect levels). The schematic shows a substrate 601 supporting a first copper wire layer 602, a second copper wire layer 604, and copper via structure 606 connecting the two copper layers each of which may be formed using conventional techniques. The substrate 601 is typically a semiconductor substrate containing active and/or passive elements (possibly including lower interconnect levels) requiring electrical interconnection. The sidewalls and bottoms of both copper wire layers 602 and 604 and the via structure 606 are lined with a TaN/Ta or other barrier layer 612, which may be formed using conventional techniques. First inter-level dielectric layer 608 and second inter-level dielectric layer 610 provide electrical insulation between copper wire layers and may be formed using conventional techniques. It is often desirable that the inter-level dielectric layers 608 and 610 may be porous to enhance their dielectric properties. In such cases, the inter-level dielectric layers may optionally have deposited upon them hardmask layers such as, for example, first hardmask layer 609 and second hardmask layer 611, respectively, which are each composed of materials such as SiO$_2$, SiC or Si$_3$N$_4$, and each of which may be deposited using conventional techniques. The top surfaces of first copper wire layer 602, first inter-level dielectric layer 608 (or optionally, if present, the top surface of first hardmask layer 609, second copper wire layer 604 and second inter-level dielectric layer 610 (or optionally, if present, the top surface of second hardmask layer 611) are all capped by GCIB processing to form capping films 614, 616, 618, and 620. This second embodiment is distinguishable from the first in that the element(s) comprising the GCIB gas-cluster ions are chosen such that the infused species retain conductor characteristics on the copper surfaces, (copper capping films 614 and 618). However, the infusing element(s) are also selected so that the same element(s) form insulating films when infused into the surfaces of the inter-level dielectric and/or dielectric hardmask materials in the dielectric regions of each interconnect level (inter-level dielectric or hardmask capping films 616 and 620). Enhanced dielectric diffusion barriers (barrier film 622 for the first interconnect level, and barrier film 624 for the second interconnect level), are preferably formed by GCIB deposition, but may also be formed by conventional techniques. Such barrier films further enhance the diffusion barrier performance and via etch-stop properties of the GCIB infused cap.

A GCIB infusion process is preferably applied at the top surface of each interconnection level in order to form copper and inter-level dielectric caps. As noted above, GCIB in-situ cleaning is preferably used following CMP planarization of the copper interconnect and inter-level dielectric. FIG. 5G illustrates a wiring scheme 600G in which the inter-level dielectric layers 608 and 610 do not have hardmask layers 609 and 611 on their top surfaces. A description will now be provided of a process for constructing wiring scheme 600G.

Figure 5B:
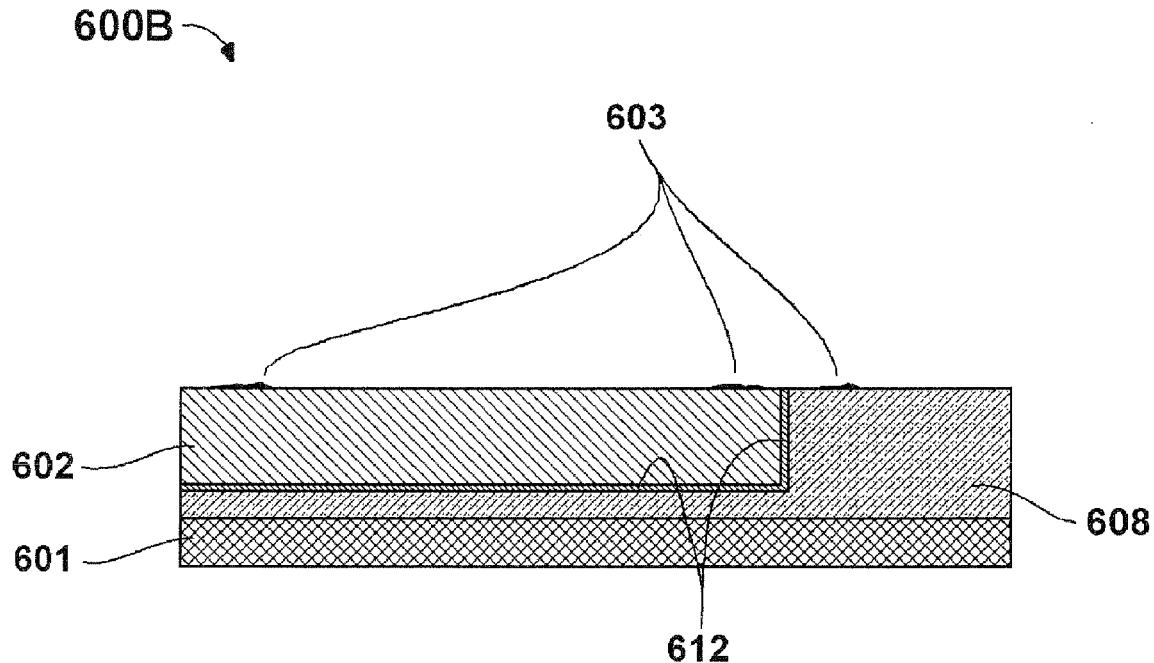

FIG. 5B shows a preliminary stage 600B of wiring scheme 600G. An interconnect level built upon substrate 601 is comprised of a conventionally deposited first inter-level dielectric 608, in which trenches and vias have been formed and lined with a barrier layer 612. Copper has been deposited in the trenches and vias using conventional techniques. The upper surface of the structure has been planarized and cleaned. The upper surfaces of first copper wire layer 602 and first inter-level dielectric layer 608 are shown to have residual contaminants 603. At the top surface(s) of this stage and each stage of each subsequent interconnect level (assuming more than one interconnect level), the GCIB cleaning process may be performed as described above. It is preferable, although not essential to the invention, that this GCIB cleaning process be an in-situ cleaning process.

Figure 5C:
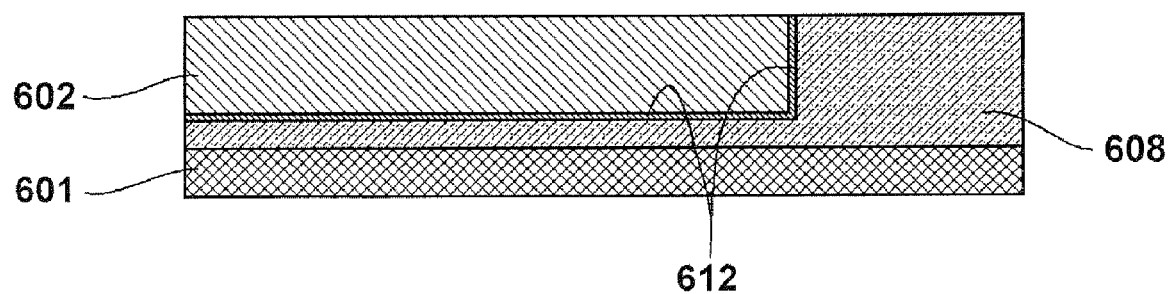

FIG. 5C shows an intermediate stage 600C in the construction of wiring scheme 600G, following the GCIB cleaning step. The upper surfaces of first copper wire layer 602 and first inter-level dielectric layer 608 have been cleaned of contaminants and are prepared for a capping step. A GCIB capping process may now be applied at the cleaned top surface(s) of this stage and each stage of each subsequent interconnect level (assuming more than one interconnect level.) A (preferably in-situ) GCIB infusion process is used to cap the planarized surface (copper and/or exposed inter-level dielectric), simultaneously (or alternatively, by separate capping GCIBs.) The GCIB capping process involves irradiating the upper surfaces of first copper wire layer 602 and first inter-level dielectric layer 608 with a GCIB comprised of reactive elements that form electrically conducting materials upon their infusion into copper surfaces, but which form electrically insulating materials upon infusion into inter-level dielectric surfaces. In addition, these conducting elements are selected so as to not have a high solid solubility in copper, to avoid adversely affecting its electrical conductivity. Without limitation, GCIBs with gas-cluster ions comprising the elements B or Ti are suitable and combine with appropriate dielectric hardmask materials such as, but not limited to, $SiO_2$, SiC, SiCN, SiCOH, etc., to form insulating oxides, carbides or nitrides. Some suitable source gases containing B, and Ti include, but are not limited to, $B_2H_6$, $TiCl_4$, tetra diethylamino titanium (TDEAT), and tetra dimethylamino titanium (TDMAT). These gases can be used in their pure form or by mixing with inert gases such as, for example, Ar or Xe. On dielectric surfaces, such infusions form, for example, graded films of $TiO_2$ and borosilicate glass, while on copper surfaces, they form, for example, graded films of boron and titanium. With reference to the GCIB apparatus 100 of FIG. 3, a beam acceleration potential, $V_{Acc}$, preferably in the range of from about 3 kV to about 50 kV may be used, and a total gas-cluster ion dose in the range of from about $1\times10^{14}$ to about $1\times10^{17}$ ions/cm². On copper and dielectric surfaces, the impact energy of the GCIB infusion process creates a transient high temperature zone which promotes the reaction of the infusing species with existing dielectric, or dielectric hardmask layers to form new insulating (on inter-level dielectric or hardmask) materials and also forms an infused conducting film on the copper wire surface thereby limiting copper interface diffusion and improving electromigration lifetime. The single GCIB capping infusion step therefore forms an electrically conducting capping film 614 on a first copper wire layer 602 and an electrically insulating capping film 616 on the first inter-level dielectric layer 608.

Figure 5D:
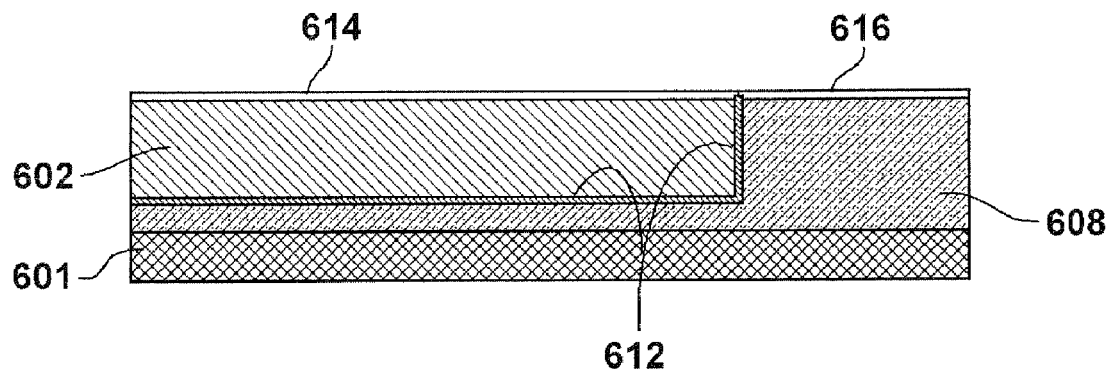

FIG. 5D shows a stage 600D in the construction of wiring scheme 600G subsequent to the GCIB capping step. A GCIB process may be performed at the top surface(s) of this stage and each stage of each subsequent interconnect level to form a dielectric diffusion barrier film. The dielectric diffusion barrier film 622 is preferably composed of silicon carbon nitride, but may be, silicon nitride, silicon carbide or other dielectric film. It may be conventionally deposited by PECVD, but preferably it is deposited by irradiating the surface of the capping film (614 and 616) upon which the barrier film 622 is to be deposited with a GCIB formed of elements that react to deposit insulating materials. GCIBs with gas-cluster ion elements such as, for example, C, N, and Si, or mixtures thereof are suitable and can deposit diffusion barrier films such as, for example, $Si_3N_4$, SiCN, and SiC on copper. Source gases such as C, N, and Si include but are not limited to $CH_4$, $SiH_4$, $NH_3$, and $N_2$. Such gases can be used to form gas-cluster ions for deposition either by using the pure gases or by mixing them with inert gases as, for example, Ar or Xe. Beam acceleration potential, $V_{Acc}$, preferably in the range of from about 3 kV to about 50 kV is used with a total gas-cluster ion dose in the range of from about $1\times10^{14}$ to about $1\times10^{17}$ ions/cm².

Figure 5E:
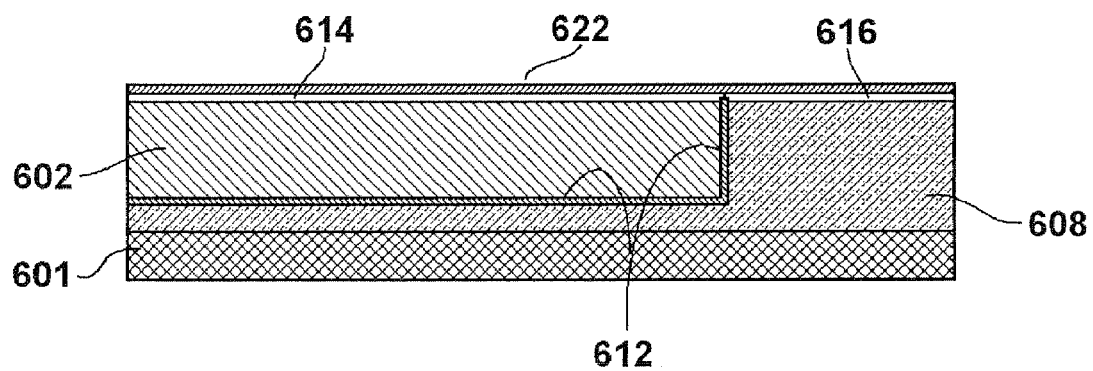
Figure 5F:
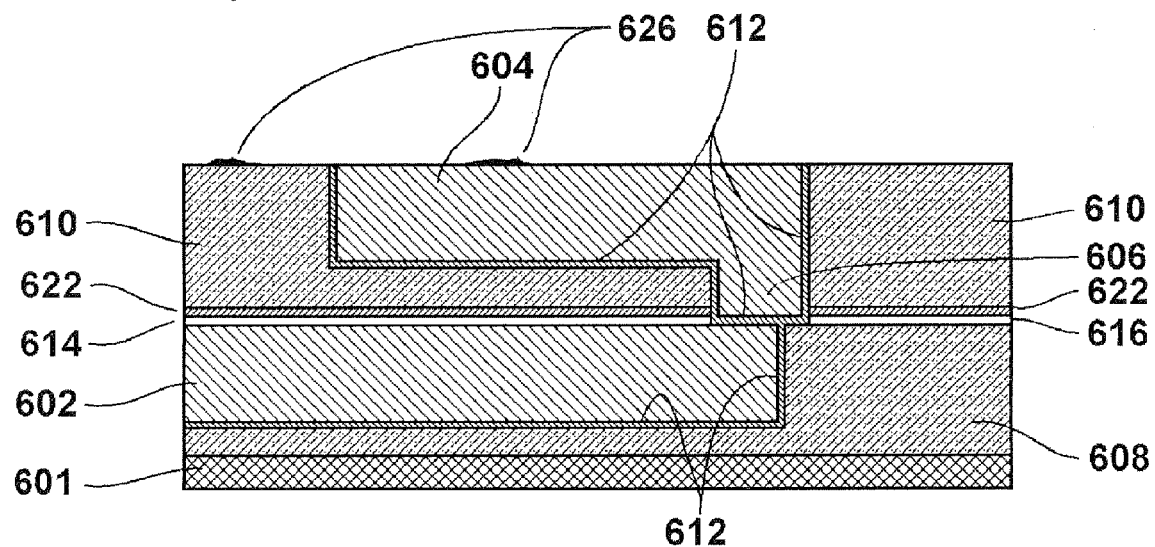
Figure 5G:
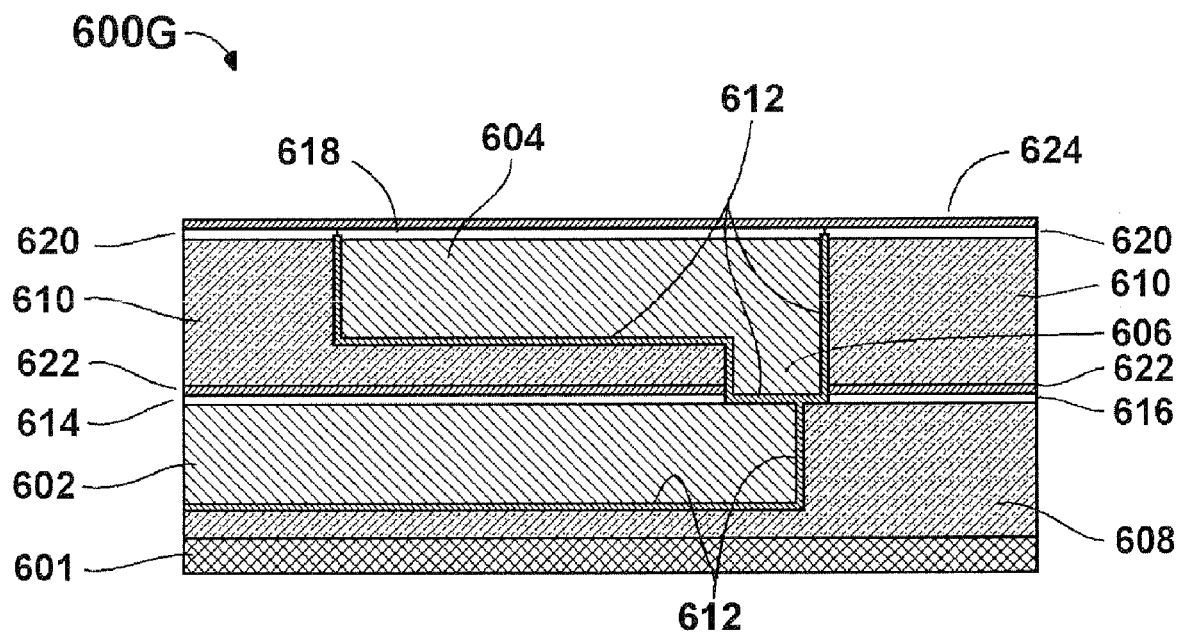

FIG. 5E shows a stage 600E in the construction of wiring scheme 600G subsequent to the deposition of barrier film 622. FIG. 5F shows a stage 600F in the construction of wiring scheme 600G, reflecting the addition of a second interconnect level upon the GCIB capped (including dielectric barrier film) first interconnect level and the barrier film 622. The second interconnect level is comprised of a second inter-level dielectric 610 deposited on the barrier film 622, in which trenches and vias have been formed and lined with a barrier layer 612. Copper has been deposited in the trenches and vias using conventional techniques. The upper surface of the structure has been planarized and cleaned utilizing conventional processes. The upper surfaces of second copper wire layer 604 and second inter-level dielectric layer 610 are shown to have residual contaminants 626. At the top surface(s) of the second interconnect level and at subsequent higher interconnect levels (if any), GCIB cleaning and GCIB infusing and GCIB deposition steps may be applied as described above to construct wiring scheme 600G. These processing steps result in the formation of capping films 618, 620 and barrier film 624. Accordingly, the two interconnect level structure of FIG. 5G or multi-level interconnect structures may be formed as desired.

Figure 5H:
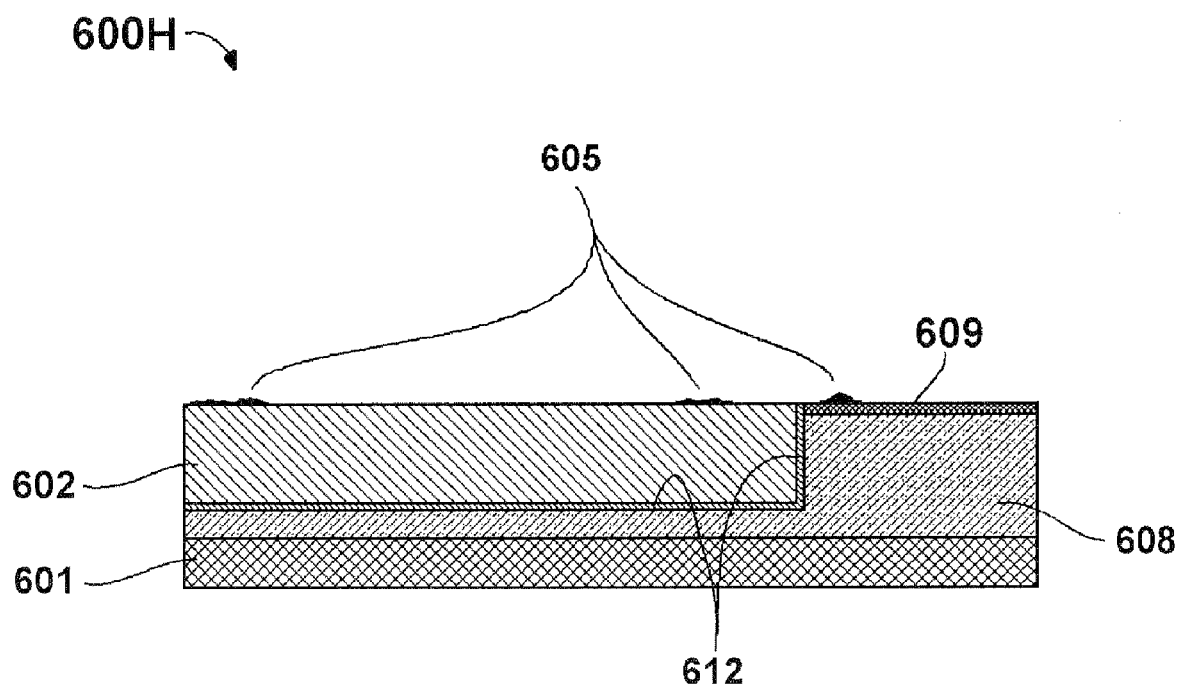

FIG. 5H shows a preliminary stage 600H in the process of constructing the wiring scheme 600 (with hardmask layers 609 and 611) as shown complete in FIG. 5A. A first interconnect level built upon substrate 601 is comprised of a first inter-level dielectric 608 deposited on the substrate using conventional techniques. A hardmask layer 609, formed by conventional techniques, covers the top surface of first inter-level dielectric 608. Trenches and vias have been formed in the first inter-level dielectric 608 and lined with a barrier layer 612, and copper has been deposited in the trenches and vias. The upper surface of the structure has been planarized and cleaned utilizing conventional cleaning processes. The upper surfaces of first copper wire layer 602 and hardmask layer 609 are shown to have residual contaminants 605. At the top surface(s) of this stage and at a corresponding stage of each subsequent interconnect level, a GCIB cleaning process is preferably performed as described above. It is preferable, although not essential to the invention that this GCIB cleaning process be an in-situ cleaning process.

Figure 5I:
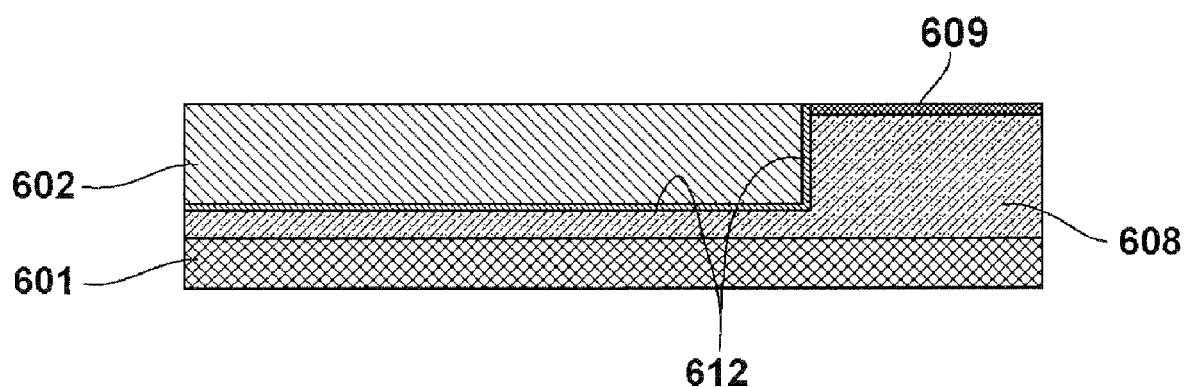

FIG. 5I shows a stage 600I in the process of constructing the wiring scheme 600 (of FIG. 5A), following the GCIB cleaning step. The upper surfaces of first copper wire layer 602 and hardmask layer 609 have been cleaned of contaminants and are prepared for a capping step. At the top surface(s) of this stage and each corresponding stage of each subsequent interconnect level, a GCIB capping process may be performed as described above to form capping layers 614 and 616. In this embodiment, capping layer 616 is formed on hardmask layer 609 rather than directly on the first inter-level dielectric layer 608.

Figure 5J:
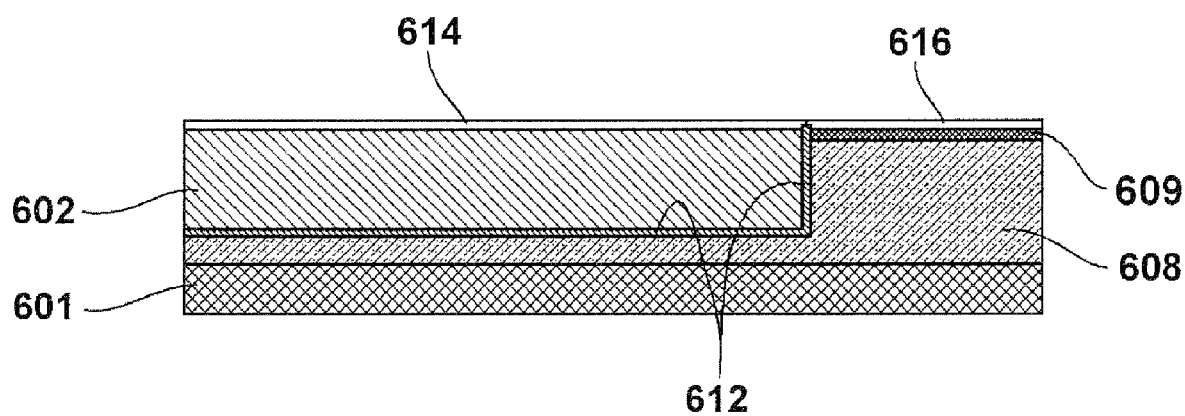

FIG. 5J shows a stage 600J in the process of constructing wiring scheme 600, following the step of forming capping layers 614 and 616. A GCIB process, as described above, may be applied to the top surface(s) of this stage and each corresponding stage of each subsequent interconnect level to form a dielectric diffusion barrier film 622 on the capping layers 614 and 616.

Figure 5K:
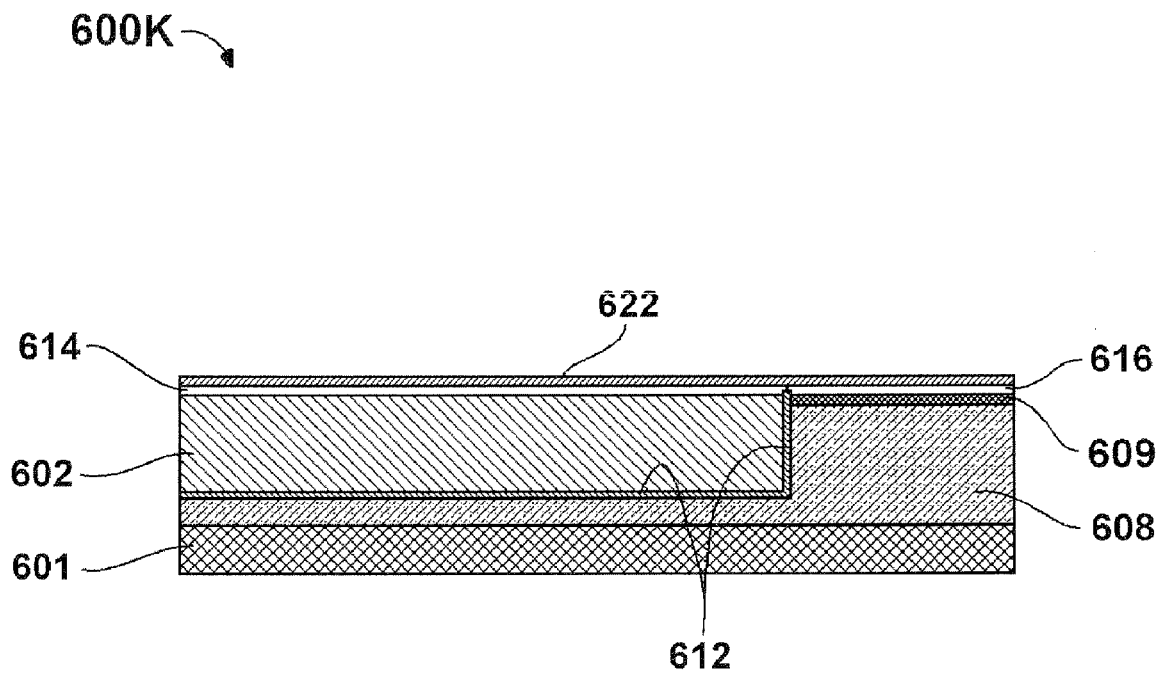

FIG. 5K shows a stage 600K in the process of constructing wiring scheme 600, following the deposition of barrier film 622.

Figure 5L:
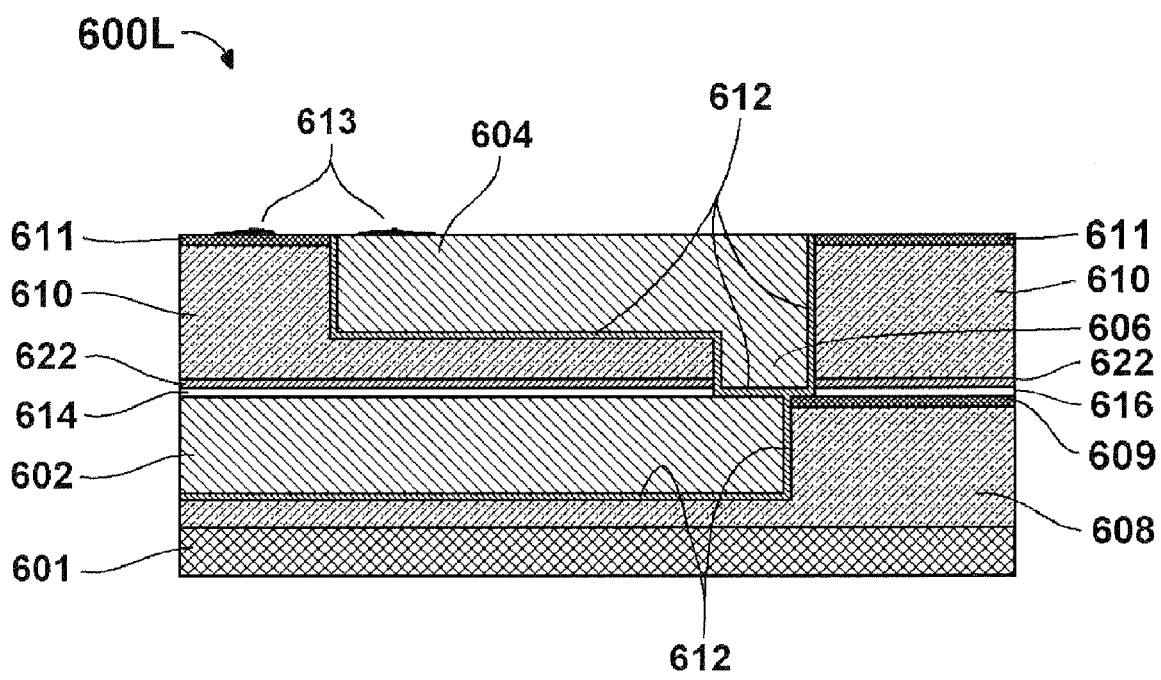

FIG. 5L shows a stage 600L in the process of constructing wiring scheme 600, following the addition of a second interconnect level upon the GCIB capped (including dielectric barrier film) first interconnect level. At this stage, a second interconnect level has been formed on the barrier film 622. The second interconnect level is comprised of a second inter-level dielectric 610 that has been deposited on the barrier film 622 using conventional techniques. A hardmask layer 611, formed by conventional techniques, covers the top surface of first inter-level dielectric 610. Conventional trenches and vias have been formed in the second inter-level dielectric 610, the trenches and vias have been lined with a conventional barrier layer 612, and copper has been deposited in the trenches and vias using conventional techniques. The upper surface of the structure has been planarized and cleaned utilizing conventional processes. The upper surfaces of second copper wire layer 604 and hardmask layer 611 are shown to have residual contaminants 613. At the second interconnect level (if any) and at subsequent higher interconnect levels (if any) GCIB cleaning and GCIB infusing and GCIB deposition steps are applied as described above for wiring scheme 600, forming (for example) capping films 618 and 620 and forming barrier film 624. Accordingly, the two interconnect level structure of FIG. 5A or multi-level interconnect structures may be formed as desired.

Accordingly, the disclosed techniques provide for reduced electromigration, yet avoid the undesirable side effects associated with selective metal capping processes. On the dielectric surfaces, the dielectric remains insulating after capping and the extremely thin infusion layer has negligible effect on the dielectric constant.

Figure 6A:
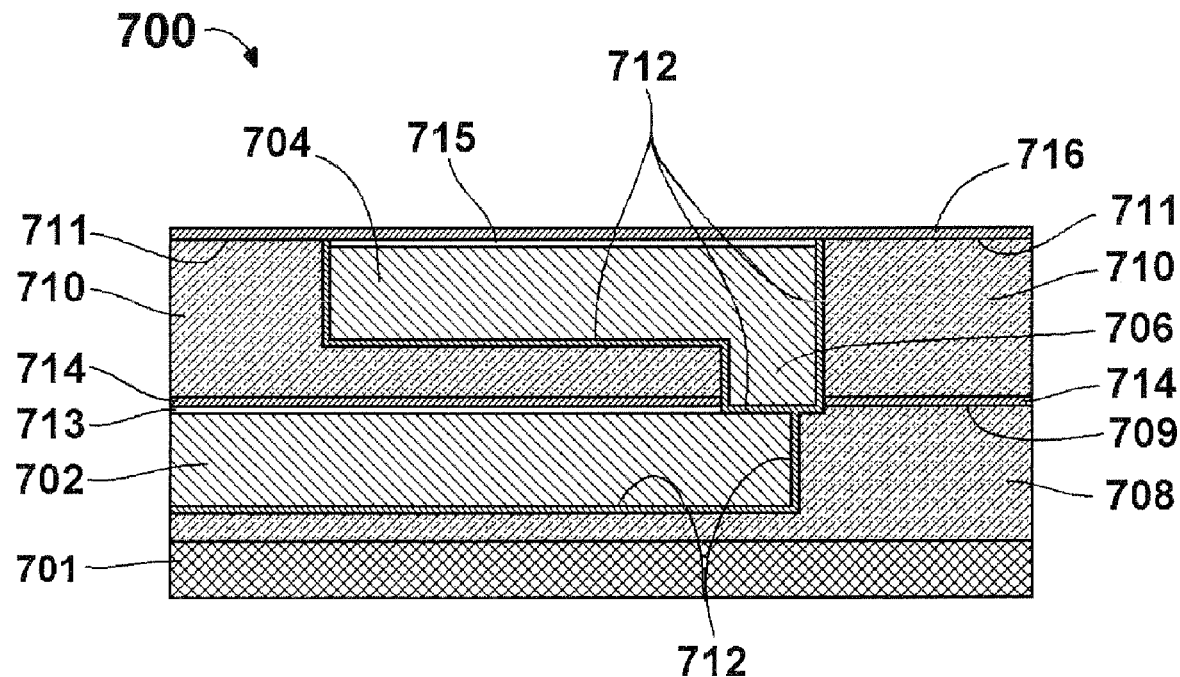
FIGS. 6A, 6B, 6C, 6D, 6E, 6F, and 6G are schematics showing a process of copper interconnect capping by using GCIB infusion and deposition according to a third embodiment of the invention.

FIG. 6A is a schematic showing a wiring scheme 700 of a copper interconnect capped using GCIB infusion according to a third embodiment of the invention (showing for example, not for limitation, two copper wire layer interconnect levels). The schematic shows a substrate 701 supporting a first copper wire layer 702, a second copper wire layer 704, and copper via structure 706 connecting the two copper layers, each of which may be formed using conventional techniques. The substrate 701 is typically a semiconductor substrate containing active and/or passive elements (possibly including lower interconnect levels) requiring electrical interconnection. The sidewalls and bottoms of both copper wire layers 702 and 704 and the via structure 706 are lined with a barrier layer 712, which may be formed using conventional techniques. First inter-level dielectric layer 708 and second inter-level dielectric layer 710 provide electrical insulation between copper wires and may be formed using conventional techniques. First inter-level dielectric layer 708 has an upper surface 709 and second inter-level dielectric layer 710 has an upper surface 711. As will be explained in more detail below, at each copper wire interconnect level, as conventionally deposited, the barrier layer 712, initially covers the upper surfaces 709 and 711 of the inter-level dielectric layers 708 and 710. In this embodiment of the invention, GCIB processing described hereinafter removes the barrier layer 712 material from the upper surfaces 709 and 711 and therefore it does not appear on those surfaces in the completed structure shown in FIG. 6A. The top surface of first copper wire layer 702 and the top surface of the second copper wire layer 704 are capped by GCIB processing to form infused capping films 713 and 715. The infused copper capping films 713 and 715 and the adjacent inter-level dielectric layers 708 and 710, respectively, may additionally be capped with dielectric barrier films 714 and 716, respectively, to provide improved copper diffusion barrier and via etch-stop properties. Dielectric barrier films 714 and 716 are preferably silicon carbon nitride but can also be silicon nitride or silicon carbide or other suitable dielectrics and may be conventionally deposited using PECVD, but are preferably applied by GCIB deposition.

Figure 6B:
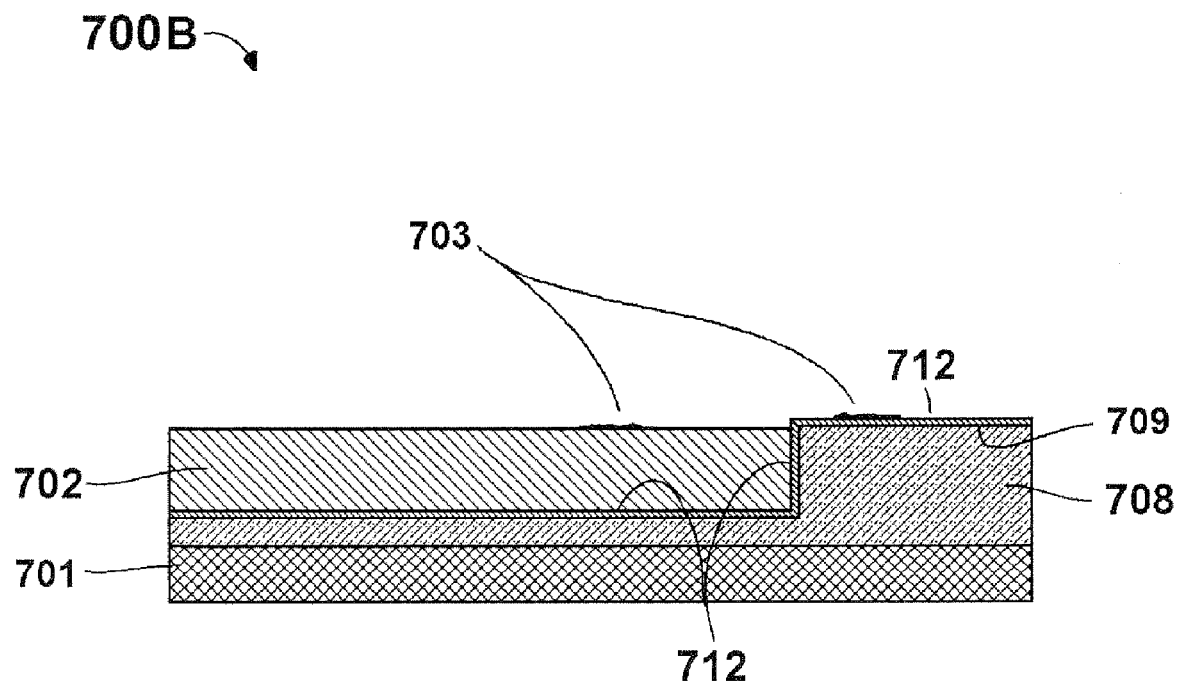

FIG. 6B shows a preliminary stage 700B in the process of constructing wiring scheme 700. In the stage illustrated, an interconnect level has been formed on a substrate 701. The interconnect level is comprised of a first inter-level dielectric 708 that has been deposited on the substrate. Trenches and vias have been formed in the first inter-level dielectric 708 and lined with a barrier layer 712. Copper has been deposited in the trenches and vias. The barrier layer 712 initially covers the upper surfaces 709 of the inter-level dielectric layer 708. The copper overburden has been removed by conventional CMP, stopping on the material of the barrier layer 712. Additionally, by using conventional CMP process conditions chosen to preferentially remove copper at a much higher rate than barrier layer material, for example by using a highly selective slurry that selectively removes copper compared to the barrier material, the copper has been recessed slightly below the top surface of the barrier layer 712 as shown. The surface has been cleaned utilizing conventional processes. The upper surfaces of first copper wire layer 702 and barrier layer 712 are shown to have residual contaminants 703. A GCIB cleaning process as described above may be applied at the top surface(s) of this stage and each stage of each subsequent interconnect level.

Figure 6C:
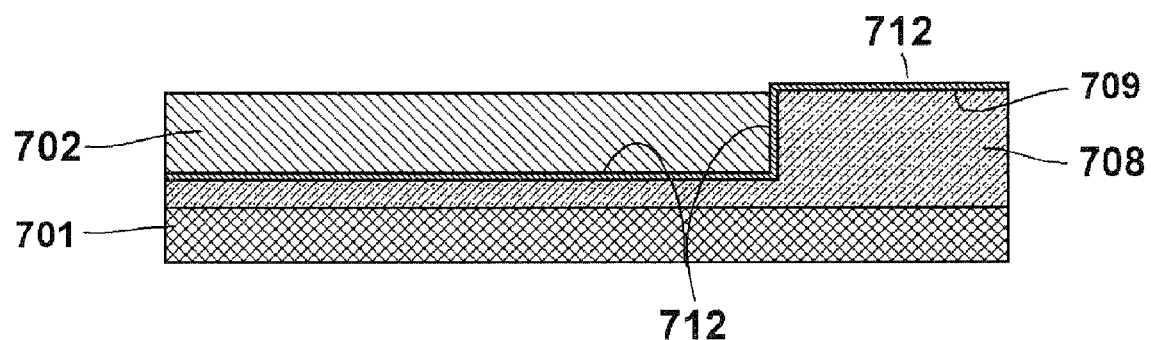

FIG. 6C shows a stage 700C of the process of constructing wiring scheme 700, following the GCIB cleaning step. The upper surfaces of first copper wire layer 702 and barrier layer 712 have been cleaned of contaminants and are prepared for a capping step. A GCIB capping process may now be applied. A (preferably in-situ) GCIB etching and infusion capping process is used to simultaneously cap the surface of first copper wire layer 702 and etch away the barrier layer 712, where it overlies the upper surface 709. The GCIB etching and capping process involves irradiating the upper surfaces of first copper wire layer 702 and first inter-level dielectric layer 708 with a GCIB comprised of reactive elements that form capping materials upon their infusion into copper surfaces, but which etch barrier layer 712 materials. The GCIB irradiation, which etches away the exposed barrier layer 712 material on the upper surfaces 709 while at the same time infusing a capping species into the first copper wire layer 702, forming a capping films 713. Source gases containing the elements fluorine and/or sulfur, including, but not limited to $SF_6$, $CF_4$, $C_4F_8$ or $NF_3$ are used in forming the GCIB. These gases can be used to form gas-cluster ions for infusion either by using the pure gases or by mixing with $N_2$ or with inert gases as, for example, Ar or Xe. Such infusions form copper capping films such as, for example $CuF_2$. Beam acceleration potential, $V_{Acc}$, preferably in the range of from about 10 kV to about 50 kV is used, and with nozzle gas flows in the range of about 200 sccm to about 3000 sccm may be used. For example, a preferred process for etching barrier layer materials while simultaneously forming a copper capping film uses a source gas mixture of 10% $NF_3$ in $N_2$ at a flow rate of 700 sccm. The GCIB etch and infusion process proceeds until all of the barrier layer material is removed, which results in a relatively unaltered upper surface 709 of the first inter-level dielectric layer 708, and also results in copper surfaces which have been infused with a capping film 713. There is little effect on the upper surface 709 since during the majority of the process it is shielded form the GCIB by barrier layer 712 material.

Figure 6D:
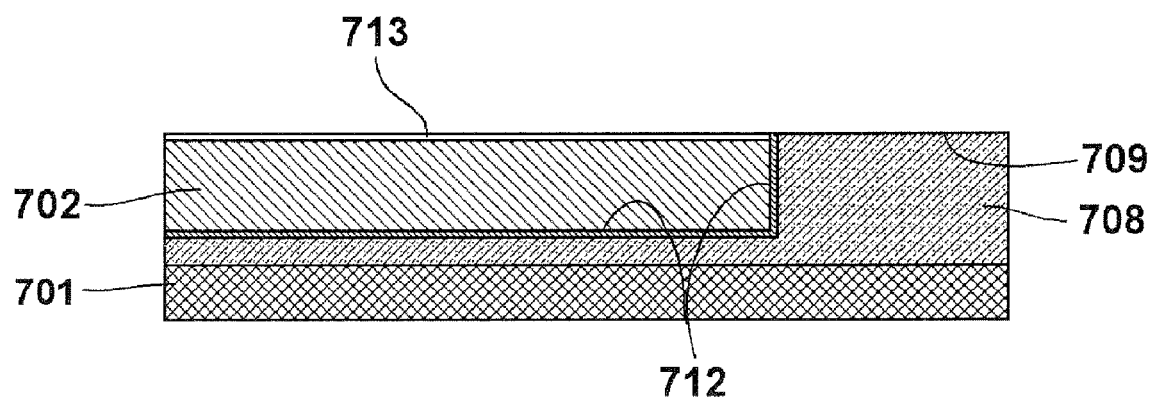

FIG. 6D shows a stage 700D in the process of constructing wiring scheme 700, following the GCIB etching and capping step. The upper surfaces of first copper wire layer 702 has been capped by capping layer 713 and barrier layer 712 has been etched away, exposing the upper surface 709 of first inter-level dielectric layer 708. The structure is prepared for formation of a dielectric barrier film. A GCIB process may now be performed to form a dielectric diffusion barrier film 714 on the capping layer 713 and on the upper surface 709 of first inter-level dielectric layer 708, using the same method as described above for depositing barrier film 622.

Figure 6E:
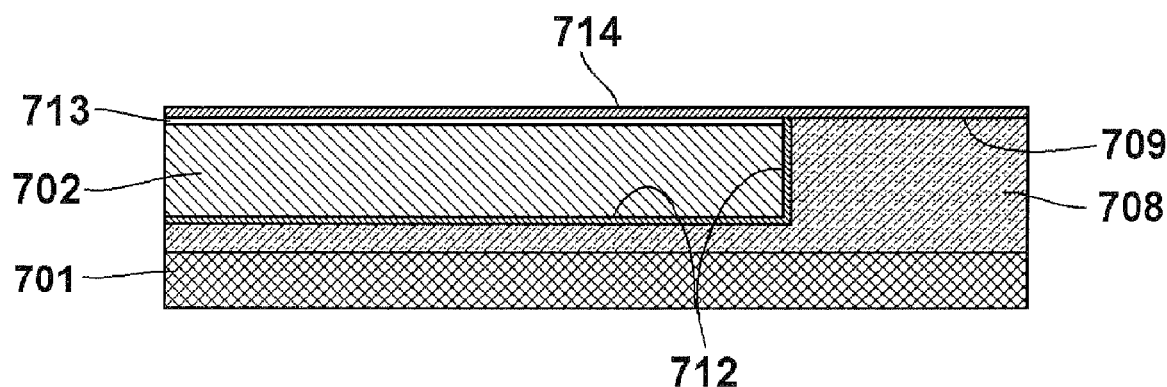

FIG. 6E shows a stage 700E in the process of constructing wiring scheme 700, following the formation of dielectric diffusion barrier film 714.

Figure 6F:
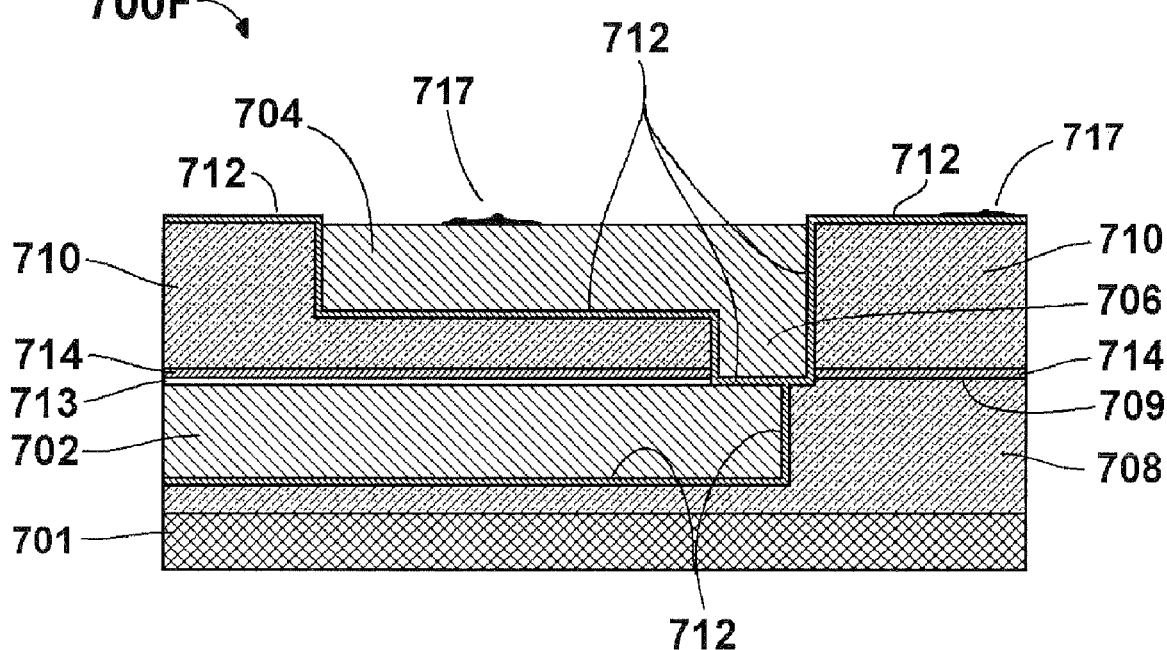

FIG. 6F shows a stage 700F in the process of constructing wiring scheme 700 of a second interconnect level upon the GCIB capped (including dielectric barrier film) first interconnect level. At this stage, a second interconnect level has been formed on the barrier film 714. The second interconnect level consists of a second inter-level dielectric 710 that has been deposited on the barrier film 714. Trenches and vias have been formed in the second inter-level dielectric 710 and lined with a barrier layer 712. Copper has been deposited in the trenches and vias using conventional techniques. Barrier layer 712 initially covers the upper surface of the inter-level dielectric layer 710. The copper overburden has been removed by conventional CMP, stopping on the material of the barrier layer 712. Additionally, by using conventional CMP process conditions chosen to preferentially remove copper at a much higher rate than barrier layer material, for example by using a highly selective slurry that selectively removes copper compared to the barrier material, the copper has been recessed slightly below the top surface of the barrier layer 712 as shown. The surface has been cleaned utilizing conventional processes. The upper surfaces of second copper wire layer 704 and barrier layer 712 are shown to have residual contaminants 717. At the second interconnect level (if any) and at subsequent higher interconnect levels (if any) GCIB cleaning and GCIB (etching and infusion capping) and GCIB deposition steps are applied as described above for the first interconnect level in wiring scheme 700, forming (for example) capping film 715 and barrier film 716. Accordingly, the two interconnect level structure of FIG. 6A or multi-level interconnect structures may be constructed as desired.

Following the CMP copper overburden removal described in wiring scheme 700 above, if the exposed barrier layer material has an undesirable spatially non-uniform thickness, it is optional but preferred to make the GCIB etch spatially non-uniform in a compensatory manner. By first mapping the barrier layer thickness across the surface of the workpiece wafer using a conventional metal film mapping instrument (for example, a Rudolph Technologies METAPULSE®-II metal film measurement system, commercially available from Rudolph Technologies, Inc., One Rudolph Road, Flanders, N.J. 07836, U.S.A.) it is then possible to make the barrier layer etch as described above to be a compensatory etch resulting in greater etching where the barrier layer material is thicker and less etching where the barrier layer material is thinner, thus minimizing removal of the underlying inter-level dielectric in regions that otherwise would be over-etched due to the initial thinness of the barrier layer material. This spatially compensatory etching is accomplished by using a measured barrier layer thickness map in combination with techniques taught in U.S. Pat. No. 6,537,606 to Allen et al. (the '606 patent), the contents of which are incorporated herein by reference. Gas-cluster ion beam processing equipment, such as the Epion Corporation nFusion™ GCIB Processing System, (Epion Corporation, Billerica, Mass.) equipped with automatic compensatory etching capability working from measurement maps according to techniques disclosed in the '606 patent is commercially available.

Figure 6G:
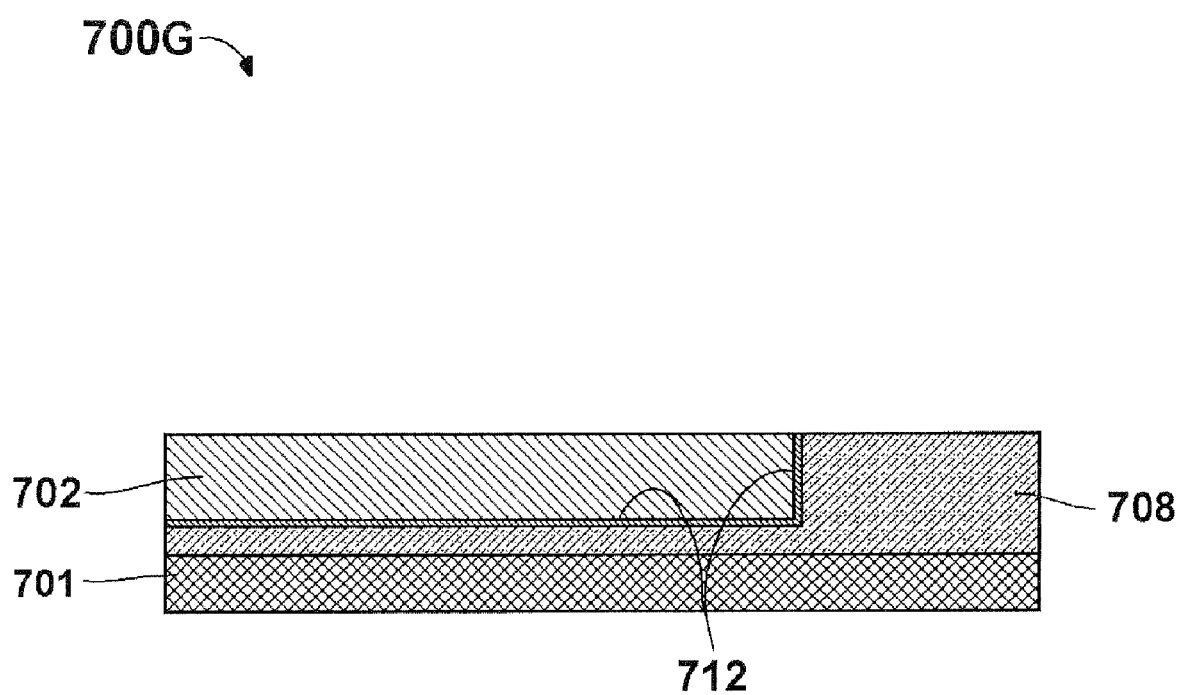

In this embodiment of the invention it is preferable that the barrier layer etch and the copper capping both be performed in a single step using GCIB processing to perform both simultaneously, as described above. It is also possible, and may be useful in some circumstances, to perform the barrier layer etch and the copper capping processing as separate GCIB processing steps, using GCIBs with different characteristics for each step. In such case, upon reaching the stage illustrated in FIG. 6C, the barrier layer material initially overlying the upper surface 709 of the inter-level dielectric layer 708 is removed by a GCIB etching process prior to a GCIB capping step. Following the GCIB etching step, the structure appears as shown in FIG. 6G and is prepared for copper wire layer and inter-level dielectric layer capping, which is performed using the GCIB capping processes described hereinbefore in the various embodiments of this invention. At each interconnect level, the preferred etching step is to irradiate the surface to be cleaned with GCIB cluster ions formed from source gas or gases containing the element fluorine, such gases include, but are not limited to $SF_6$, $CF_4$, $C_4F_8$ or $NF_3$. These gases can be used to form gas-cluster ions for etching either by using the pure gases or by mixing with $N_2$ or with inert gases as, for example, Ar or Xe. Beam acceleration potential, $V_{Acc}$, preferably in the range of from about 10 kV to about 50 kV is used, and nozzle gas flows in the range of about 200 sccm to about 3000 sccm may be used. For example, a preferred process for etching barrier layer materials uses a source gas mixture of 10% $NF_3$ in $N_2$ at a flow rate of 700 sccm. When required, the GCIB etching step can be a compensatory etching step as described hereinbefore to compensate for initial spatial non-uniformity in the thickness of the barrier layer material.

Although the invention has been described with respect to various embodiments, it should be realized this invention is also capable of a wide variety of further and other embodiments within the spirit of the invention. For example, it will be evident to those skilled in the art that the invention is not limited to dual damascene integration schemes and is equally applicable to other copper interconnect schemes. Further, although the invention has been described in terms of infused and deposited films or layers comprising various compounds (such as, for example, $Si_3N_4$, SiC, SiCN, BN, $CuF_2$, $TiO_2$, $CuCO_3$, B, Ti, silicon nitride, silicon carbide, silicon carbon nitride, boron nitride, copper fluoride, titanium dioxide, copper carbonate, boron, titanium, and borosilicate glass) it will be understood by those skilled in the art, that many of the films and layers formed in practicing the invention are graded and that even in the purest forms, they do not have the precision stoichiometries implied by the chemical formulas or names, but rather have approximately those stoichiometries and may additionally include hydrogen and/or other impurities as is normal for such films used in analogous applications.

It is claimed:

1. On a semiconductor structure including one or more different material surfaces, a method of forming capping structures, comprising the steps of:
    disposing the semiconductor structure in a reduced pressure chamber;
    forming a capping GCIB within the reduced pressure chamber; and
    directing the capping GCIB onto at least one of the one or more different material surfaces, so as to form at least one capping structure on the one or more surfaces onto which the capping GCIB is directed, wherein the GCIB exposure initially forms a graded layer containing a mixture of GCIB species and a material of the one or more different material surfaces, and upon continued GCIB exposure deposits a film onto the graded layer, the deposited film containing the GCIB species and not the material from the one or more different material surfaces.

2. The method of claim 1, wherein the deposited film comprises an insulating layer deposited onto the graded layer.

3. The method of claim 1, wherein the deposited film comprises a dielectric diffusion barrier film deposited onto the graded layer.

4. The method of claim 3, wherein the deposited film is comprised of a material selected from the group consisting of silicon carbide, silicon nitride, and silicon carbon nitride.

5. The method of claim 1, wherein forming the capping GCIB further comprises accelerating the generated gas cluster ions with an acceleration potential in the range of from about 3 kV to about 50 kV.

6. The method of claim 1, wherein the step of directing the capping GCIB results in an irradiated dose in the range of from about $1\times10^{14}$ to about $1\times10^{17}$ gas-cluster ions/cm$^2$ being delivered to at least one of the one or more different material surfaces.

7. The method of claim 1, further comprising, prior to the capping GCIB forming and directing steps, the steps of: forming a cleaning GCIB within the reduced pressure chamber; and directing the cleaning GCIB onto the one or more different material surfaces, so as to clean the one or more surfaces onto which the cleaning GCIB is directed.

8. The method of claim 7, wherein forming a cleaning GCIB further comprises generating gas-cluster ions from molecules of at least one gas selected from the group consisting of Ar, $N_2$, $NH_3$, and $H_2$.

9. The method of claim 7, wherein forming the cleaning GCIB further comprises accelerating cleaning GCIB gas cluster ions with an acceleration potential in the range of from about 3 kV to about 50 kV.

10. The method of claim 7, wherein directing the cleaning GCIB results in an irradiated dose in the range of from about $5\times10^{13}$ to about $5\times10^{16}$ gas-cluster ions/cm$^2$ being delivered to at least one of the one or more different material surfaces.

11. The method of claim 1, wherein the one or more different material surfaces comprise a portion of an inter-level dielectric layer.

12. The method of claim 1, wherein the one or more different material surfaces comprise a portion of a hardmask layer overlying at least a portion of a porous inter-level dielectric layer.

13. The method of claim 1, wherein: forming the capping GCIB further comprises generating gas cluster ions from elements that form electrically insulating materials when infused into a copper surface and form electrically insulating materials when infused into a dielectric surface; and the at least one capping structure formed is an electrically insulating capping structure.

14. The method of claim 13, wherein the elements are comprised of at least one element selected from the group consisting of C, N, O, Si, B, and Ge.

15. The method of claim 13, wherein forming the capping GCIB further comprises generating gas cluster ions from molecules of an inert gas.

16. The method of claim 13, wherein forming the capping GCIB further comprises accelerating the generated gas cluster ions with an acceleration potential in the range of from about 3 kV to about 50 kV.

17. The method of claim 13, wherein the step of directing the capping GCIB results in an irradiated dose in the range of from about $1\times10^{14}$ to about $1\times10^{17}$ gas-cluster ions/cm$^2$ being delivered to at least one of the one or more different material surfaces.

18. The method of claim 13, further comprising the step of forming at least one insulating layer overlying the at least one capping structure formed.

19. The method of claim 18, wherein the step of forming at least one insulating layer utilizes a PECVD deposition process.

20. The method of claim 18, wherein the at least one insulating layer formed is comprised of one material selected from the group consisting of silicon carbide, silicon nitride, and silicon carbon nitride.

21. The method of claim 1, wherein: forming the capping GCIB further comprises generating gas cluster ions from elements that form electrically conductive materials when infused into a copper surface and form electrically insulating materials when infused into a dielectric surface; and the at least one capping structure formed comprises at least one of an electrically conductive capping structure on the irradiated region of a copper interconnect portion and an electrically insulating capping structure on the irradiated region of a dielectric portion.

22. The method of claim 21, wherein the elements are comprised of at least one element from the group consisting of B and Ti.

23. The method of claim 22, wherein the gas-cluster ions further comprise molecules of an inert gas.

24. The method of claim 21, further comprising the step of forming at least one dielectric diffusion barrier film overlying the at least one capping structure formed.

25. The method of claim 24, wherein the step of forming at least one dielectric diffusion barrier film utilizes a PECVD deposition process.

26. The method of claim 24, wherein the step of forming at least one dielectric diffusion barrier film utilizes a GCIB deposition process.

27. The method of claim 24, wherein the at least one dielectric diffusion barrier film formed is comprised of a material selected from the group consisting of silicon carbide, silicon nitride, and silicon carbon nitride.

28. The method of claim 21, wherein forming the capping GCIB further comprises accelerating the generated gas cluster ions with an acceleration potential in the range of from about 3 kV to about 50 kV.

29. The method of claim 21, wherein the step of directing the capping GCIB results in an irradiated dose in the range of from about $1 \times 10^{14}$ to about $1 \times 10^{17}$ gas-cluster ions/cm$^2$ being delivered to at least one of the one or more copper interconnect surfaces and the one or more dielectric surfaces.

30. The method of claim 1, wherein the at least one capping structure comprises an insulating layer.

31. The method of claim 30, wherein the insulating layer comprises a dielectric diffusion barrier film deposited onto the one or more different material surfaces.

32. The method of claim 31, wherein the dielectric diffusion barrier film is comprised of a material selected from the group consisting of silicon carbide, silicon nitride, and silicon carbon nitride.

* * * * *